US011296258B2

(12) United States Patent
Lee et al.

(10) Patent No.: US 11,296,258 B2
(45) Date of Patent: *Apr. 5, 2022

(54) LIGHT-EMITTING DIODE

(71) Applicant: SEOUL VIOSYS CO., LTD., Gyeonggi-do (KR)

(72) Inventors: Seom Geun Lee, Gyeonggi-do (KR); Chan Seob Shin, Gyeonggi-do (KR); Myeong Hak Yang, Gyeonggi-do (KR); Jin Woong Lee, Gyeonggi-do (KR)

(73) Assignee: SEOUL VIOSYS CO., LTD., Gyeonggi-do (KR)

( * ) Notice: Subject to any disclaimer, the term of this patent is extended or adjusted under 35 U.S.C. 154(b) by 127 days.

This patent is subject to a terminal disclaimer.

(21) Appl. No.: 16/705,770

(22) Filed: Dec. 6, 2019

(65) Prior Publication Data
US 2020/0176641 A1 Jun. 4, 2020

Related U.S. Application Data

(63) Continuation of application No. PCT/KR2018/008593, filed on Jul. 30, 2018.

(30) Foreign Application Priority Data

Aug. 11, 2017 (KR) .................. 10-2017-0102453
Jul. 27, 2018 (KR) .................. 10-2018-0087768

(51) Int. Cl.
  *H01L 33/40* (2010.01)
  *H01L 25/075* (2006.01)
  *H01L 33/62* (2010.01)
(52) U.S. Cl.
  CPC .......... *H01L 33/40* (2013.01); *H01L 25/0753* (2013.01); *H01L 33/62* (2013.01)

(58) Field of Classification Search
  CPC ..... H01L 33/40; H01L 25/0753; H01L 33/62; H01L 33/02; H01L 33/382; H01L 33/38;
  (Continued)

(56) References Cited

U.S. PATENT DOCUMENTS 10,270,018 B2 * 4/2019 Jang ................. H01L 33/46
10,985,206 B2 * 4/2021 Oh .................... H01L 27/15
(Continued)

FOREIGN PATENT DOCUMENTS

CN      203288637 U   11/2013
CN      106663723 A    5/2017
(Continued)

OTHER PUBLICATIONS

International Search Report and for PCT/KR2018/008593, dated Jan. 24, 2019, 8 pages.
(Continued)

*Primary Examiner* — Su C Kim
(74) *Attorney, Agent, or Firm* — Burris Law, PLLC

(57) ABSTRACT

A light emitting diode includes a first conductivity type semiconductor layer and a mesa disposed on the first conductivity type semiconductor layer wherein the mesa is a semiconductor stack including an active layer and a second conductivity type semiconductor layer; a ZnO layer disposed on the second conductivity type semiconductor layer; a lower insulation layer covering the ZnO layer and the mesa, and including an opening exposing the ZnO layer; a first pad metal layer disposed on the lower insulation layer, and electrically connected to the first conductivity type semiconductor layer; a second pad metal layer electrically connected to the ZnO layer through the opening of the lower insulation layer, and an upper insulation layer covering the first pad metal layer and the second pad metal layer.

20 Claims, 23 Drawing Sheets

(58) Field of Classification Search
CPC ......... H01L 33/42; H01L 33/10; H01L 33/44; H01L 33/46
See application file for complete search history.

(56) References Cited

U.S. PATENT DOCUMENTS

| | | | |
|---|---|---|---|
| 10,985,304 B2* | 4/2021 | Oh | ............................ H01L 33/62 |
| 2009/0065800 A1 | 3/2009 | Wirth | |
| 2011/0248301 A1* | 10/2011 | Bae | ............................ H01L 33/20 257/98 |

FOREIGN PATENT DOCUMENTS

| | | |
|---|---|---|
| JP | 2013070072 A | 4/2013 |
| KR | 10-2005-0034155 A | 4/2005 |
| KR | 10-2013-0007025 A | 1/2013 |
| KR | 10-2017-0039490 A | 4/2017 |

OTHER PUBLICATIONS

English translation of Office Action dated Nov. 29, 2021, in Chinese counterpart Application No. 201880015131.3, 6 pages.

\* cited by examiner

LIGHT-EMITTING DIODE

PRIORITY AND RELATED APPLICATIONS

The present application is a continuation of PCT Application No. PCT/KR2018/008593 filed Jul. 30, 2018, which claims priority to Korean Application Nos. 10-2017-0102453, filed Aug. 11, 2017 and 10-2018-0087768, filed Jul. 27, 2018, all of which are hereby incorporated in their entirety by reference as set forth herein.

TECHNICAL FIELD

The present disclosure relates to a light emitting diode, more specifically to a highly efficient light emitting diode.

RELATED ART

Generally, group III-based nitrides, such as gallium nitride (GaN), aluminum nitride (AlN), and the like, have been spotlighted as materials for light sources in the visible range and the ultraviolet range. Particularly, blue and green light emitting diodes using indium gallium nitride (InGaN) are used in various fields including large full color flat panel displays, signal lamps, interior lighting, vehicular headlights, high density light sources, high resolution output systems, optical communication, and the like.

Light emitting diodes require electrodes to input current. Further, since a p-type gallium nitride based semiconductor layer has a high resistivity, a current crowding problem arises. To compensate for this problem, indium tin oxide (ITO), which forms an ohmic contact with the p-type gallium nitride based semiconductor layer, is generally used.

In a case of a high output light emitting diode such as a chip scale light emitting diode package, an insulation layer for protecting the light emitting diode is formed, and an additional metal layer such as an electrode pad is formed on the insulation layer. In this case, to electrically connect the electrode pad to a transparent electrode layer, the insulation layer needs to be etched to expose ITO, but ITO may be damaged by an etchant while etching the insulation layer. In particular, since ITO has a relatively high light absorption, it is difficult to increase its thickness and thus it has generally a thickness of about 100 nm. Since thickness of ITO is relatively thin, the p-type gallium nitride based semiconductor layer may be exposed while etching the insulation layer, which may result in deterioration of a p-ohmic characteristics, thereby resulting in defects.

To prevent this, a separate metal layer may be additionally formed on ITO before the insulation layer is deposited, or an ohmic metal layer may be used instead of ITO. However, when the separate metal layer is added on ITO or the ohmic metal layer is used instead of ITO, a manufacturing process becomes complex and a cost thereof increases.

Meanwhile, light emitting diodes are used for general lighting such as filament LED lamps. A plurality of light emitting diodes is electrically connected to one another on a rod-shaped base using bonding wires. Recently, a technique has been developed capable of variously changing shapes of filaments by using flexible light straps. However, electrical connections using bonding wires are vulnerable to deformation of light straps, and thus defects such as electrical disconnection easily occur.

SUMMARY

Exemplary embodiments of the present disclosure provide a light emitting diode having a simple structure while using a transparent ohmic layer, and having improved structural stability and process stability.

Exemplary embodiments of the present disclosure provide a light emitting diode having a simple chip scale package structure capable of preventing defects such as electrical disconnection.

In accordance with one aspect of the present disclosure, a light emitting diode includes: a first conductivity type semiconductor layer and a mesa disposed on the first conductivity type semiconductor layer wherein the mesa is a semiconductor stack including an active layer and a second conductivity type semiconductor layer; a ZnO layer disposed on the second conductivity type semiconductor layer; a lower insulation layer covering the ZnO layer and the mesa, and including an opening exposing the ZnO layer; a first pad metal layer disposed on the lower insulation layer, and electrically connected to the first conductivity type semiconductor layer; a second pad metal layer electrically connected to the ZnO layer through the opening of the lower insulation layer, and horizontally spaced apart from the first pad metal layer; and an upper insulation layer covering the first pad metal layer and the second pad metal layer, the upper insulation layer having a first opening and a second opening exposing the first pad metal layer and the second pad metal layer, respectively, wherein a thickness of the ZnO layer under the opening of the lower insulation layer is smaller than that of the ZnO layer covered with the lower insulation layer.

In accordance with another aspect of the present disclosure, a light emitting diode includes: a first conductivity type semiconductor layer and a mesa disposed on the first conductivity type semiconductor layer wherein the mesa is a semiconductor stack including an active layer and a second conductivity type semiconductor layer; a ZnO layer disposed on the second conductivity type semiconductor layer; a lower insulation layer covering the ZnO layer and the mesa, and including an opening exposing the first conductivity type semiconductor layer and an opening exposing the ZnO layer; a first bump pad disposed on the lower insulation layer, and electrically connected to the first conductivity type semiconductor layer through the opening of the lower insulation layer; a second bump pad disposed on the lower insulation layer, horizontally spaced apart from the first bump pad, and electrically connected to the ZnO layer through the opening of the lower insulation layer, wherein a thickness of the ZnO layer under the opening of the lower insulation layer is smaller than that of the ZnO layer covered with the lower insulation layer.

According to exemplary embodiments of the present disclosure, a transparent electrode layer may be formed thick by using a ZnO layer having a low light absorption as the transparent electrode layer. Accordingly, although a thickness of the ZnO layer under an opening of a lower insulation layer is formed smaller than that of the ZnO layer covered with the lower insulation layer, the thickness of the ZnO layer under the opening of the lower insulation layer may be formed sufficiently thick. Therefore, it is not necessary to form a separate metal reflective layer on the transparent electrode layer or to form the metal reflective layer in place of the transparent electrode layer before forming the lower insulation layer, and thus it is possible to provide a light emitting diode having a simple process and improved structural stability. Further, according to embodiments of the present disclosure, a compact light emitting diode capable of flip chip bonding without a bonding wire may be provided.

Other advantages and effects of the exemplary embodiments of the present disclosure will become apparent from the following detailed description.

DETAILED DESCRIPTION OF THE EMBODIMENTS

Figure 1:
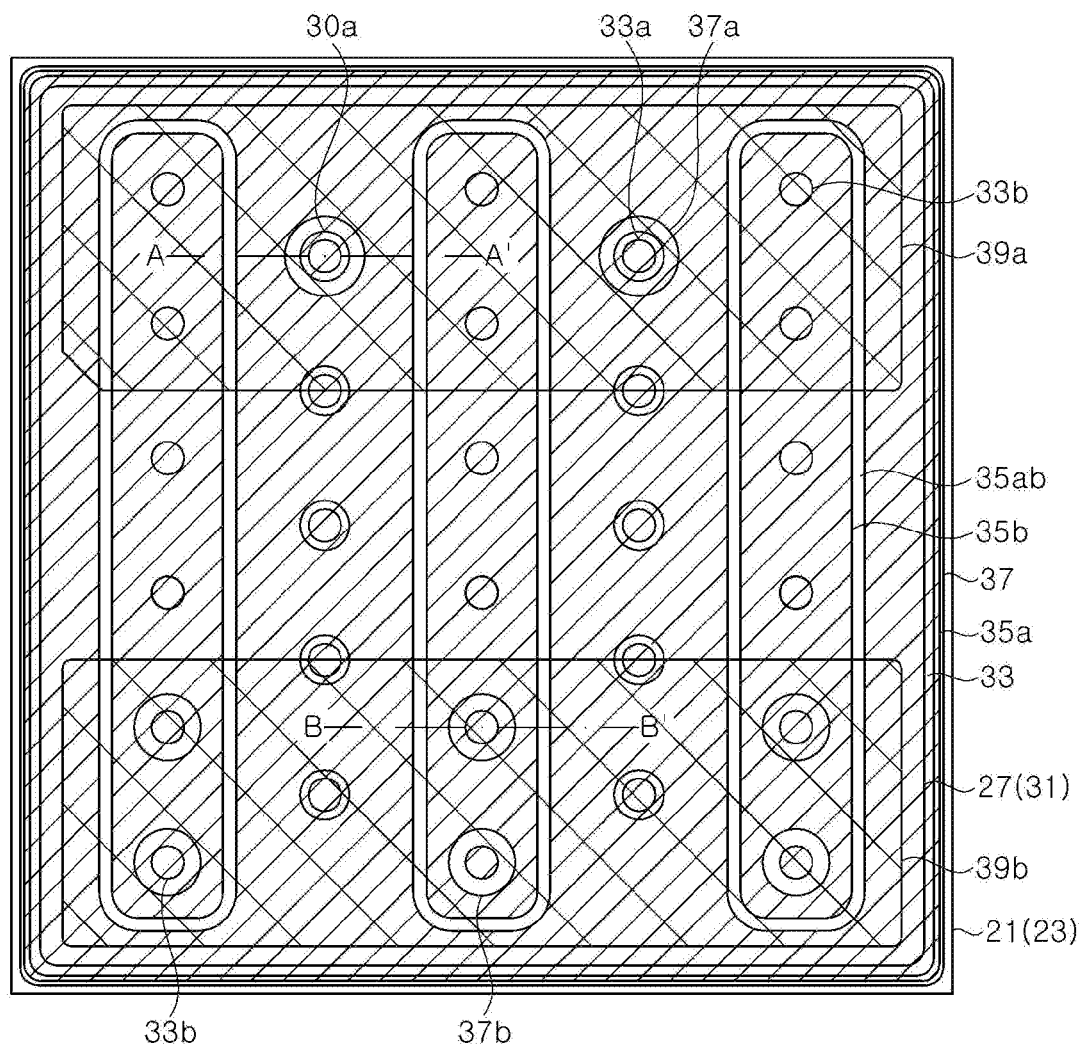
FIG. 1 is a schematic plan view of a light emitting diode according to one exemplary embodiment of the present disclosure.

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed here A plurality of light emitting diodes are electrically connected to each other through a rod-shaped base using a bonding wire.in and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

Exemplary embodiments of the present disclosure provide a light emitting diode including: a first conductivity type semiconductor layer and a mesa disposed on the first conductivity type semiconductor layer wherein the mesa is a semiconductor stack including an active layer and a second conductivity type semiconductor layer; a ZnO layer disposed on the second conductivity type semiconductor layer; a lower insulation layer covering the ZnO layer and the mesa, and including an opening exposing the ZnO layer; a first pad metal layer disposed on the lower insulation layer, and electrically connected to the first conductivity type semiconductor layer; a second pad metal layer electrically connected to the ZnO layer through the opening of the lower insulation layer, and horizontally spaced apart from the first pad metal layer; and an upper insulation layer covering the first pad metal layer and the second pad metal layer, the upper insulation layer having a first opening and a second opening exposing the first pad metal layer and the second pad metal layer, respectively, wherein a thickness of the ZnO layer under the opening of the lower insulation layer is smaller than that of the ZnO layer covered with the lower insulation layer.

In a structure where the ZnO layer having a low light absorption rate is included, the ZnO layer under the opening of the lower insulation layer may be left sufficiently thick, thereby improving a structural stability thereof. Further, since it is not necessary to use a metal reflective layer under the lower insulation layer, a manufacturing process is simple and a process stability thereof is improved.

The thickness of the ZnO layer under the opening of the lower insulation layer may be 40 to 100 nm smaller than that of the ZnO layer covered with the lower insulation layer.

Further, the thickness of the ZnO layer under the opening of the lower insulation layer may be 100 nm or more. In a structure where the thickness of the ZnO layer under the opening of the lower insulation layer is ensured to be 100 nm or more, it is possible to ensure stable ohmic contact. Although a maximum limit of the thickness of the ZnO layer under the opening of the lower insulation layer is not particularly limited, it may be 500 nm or less, for example.

The lower insulation layer may expose the first conductivity type semiconductor layer along a periphery of the mesa, and the first pad metal layer may be connected to the first conductivity type semiconductor layer exposed along the periphery of the mesa.

In particular, the lower insulation layer may include a plurality of openings exposing the first conductivity type semiconductor layer along the periphery of the mesa, and the first pad metal layer may be connected to the first conductivity type semiconductor layer through the plurality of openings.

In addition, the mesa may include a plurality of grooves disposed along a side surface thereof, where the plurality of openings of the lower insulation layer may be disposed corresponding to the plurality of grooves. Accordingly, a light emitting area may be increased within a predetermined area of light emitting diode.

The mesa may have a through hole exposing the first conductivity type semiconductor layer through the second conductivity type semiconductor layer and the active layer, the lower insulation layer may have an opening exposing the first conductivity type semiconductor layer in the through hole, and the first pad metal layer may be connected to the first conductivity type semiconductor layer in the through hole.

In one exemplary embodiment, the mesa may have a plurality of through holes, the lower insulation layer may have openings exposing the first conductivity type semiconductor layer in each through hole, and the first pad metal layer may be connected to the first conductivity type semiconductor layer in each of the through holes.

In another exemplary embodiment, the through hole may have an elongated shape along the longitudinal direction of the light emitting diode. Further, the first pad metal layer may cover the through hole, and portions of the second pad metal layer may be disposed on both sides of the through hole along the longitudinal direction of the through hole. In a structure where the second pad metal layer is disposed on both sides of the through hole along the longitudinal direction of the through hole, it is possible to assist in current spreading in the ZnO layer.

In some exemplary embodiments, the lower insulation layer may expose the first conductivity type semiconductor layer along the periphery of the mesa, and the first pad metal layer may be also connected to the first conductivity type semiconductor layer exposed along the periphery of the mesa.

In some exemplary embodiments, the first and second openings of the upper insulation layer may define pad regions of the light emitting diode. Accordingly, the bump pads may be omitted, thereby providing a light emitting diode having a simple manufacturing process.

In other embodiments, the light emitting diode may further include a first bump pad and a second bump pad disposed on the upper insulation layer, and electrically connected to the first pad metal layer and the second pad metal layer, respectively.

Further, the second pad metal layer may be surrounded by the first pad metal layer, the lower insulation layer may be exposed in a boundary region between the first pad metal layer and the second pad metal layer, and the exposed lower insulation layer may be covered with the upper insulation layer.

As a result, the first pad metal layer and the second pad metal layer may be formed in the same process at the same time.

In one exemplary embodiment, the second pad metal layer may be divided and disposed into a plurality of portions, and the first pad metal layer may surround each of the plurality of portions.

Further, the first and second bump pads may be disposed over the plurality of portions of the second pad metal layer, respectively. The second bump pad is electrically connected to the plurality of portions of the second pad metal layer, respectively.

In one exemplary embodiment, the lower insulation layer may include a plurality of openings exposing the ZnO layer. Accordingly, the second pad metal layer may be connected to the ZnO layer at a plurality of portions, and the second pad metal layer may assist in current spreading in the ZnO layer.

In one exemplary embodiment, the lower insulation layer may be a distributed Bragg reflector. Accordingly, light transmitted through the ZnO layer may be reflected by the lower insulation layer.

In another exemplary embodiment, the lower insulation layer may be formed of $SiO_2$, and the first pad metal layer and the second pad metal layer may include a metal reflective layer. Accordingly, light transmitted through the ZnO layer and the lower insulation layer may be reflected by the first pad metal layer and the second pad metal layer.

In one exemplary embodiment, the second opening of the upper insulation layer may be disposed on the opening of the lower insulation layer exposing the ZnO layer, and the first opening of the upper insulation layer is laterally spaced apart from the opening of the lower insulation layer exposing the ZnO layer.

Alternatively, both first and second openings of the upper insulation layer may be laterally spaced apart from the opening of the lower insulation layer exposing the ZnO layer.

Exemplary embodiments of the present disclosure provide a light emitting diode including: a first conductivity type semiconductor layer and a mesa disposed on the first conductivity type semiconductor layer wherein the mesa is a semiconductor stack including an active layer and a second conductivity type semiconductor layer; a ZnO layer disposed on the second conductivity type semiconductor layer; a lower insulation layer covering the ZnO layer and the mesa, and including an opening exposing the first conductivity type semiconductor layer and an opening exposing the ZnO layer; a first bump pad disposed on the lower insulation layer, and electrically connected to the first conductivity type semiconductor layer through the opening of the lower insulation layer; a second bump pad disposed on the lower insulation layer, horizontally spaced apart from the first bump pad, and electrically connected to the ZnO layer through the opening of the lower insulation layer, wherein a thickness of the ZnO layer under the opening of the lower insulation layer is smaller than that of the ZnO layer covered with the lower insulation layer.

The thickness of the ZnO layer under the opening of the lower insulation layer may be 40 to 100 nm smaller than that of the ZnO layer covered with the lower insulation layer.

Further, the thickness of the ZnO layer under the opening of the lower insulation layer may be 100 nm or more.

In addition, the lower insulation layer may include the distributed Bragg reflector.

Meanwhile, the first bump pad and the second bump pad may have widths narrower than that of the mesa.

In addition, the first bump pad may be disposed within an upper region of the mesa.

Meanwhile, the ZnO layer under the opening exposing the ZnO layer may have a smaller index of refraction than that of the ZnO layer covered with the lower insulation layer in another region.

Hereinafter, exemplary embodiments of the present disclosure will be described in detail with reference to the accompanying drawings.

Figure 2:
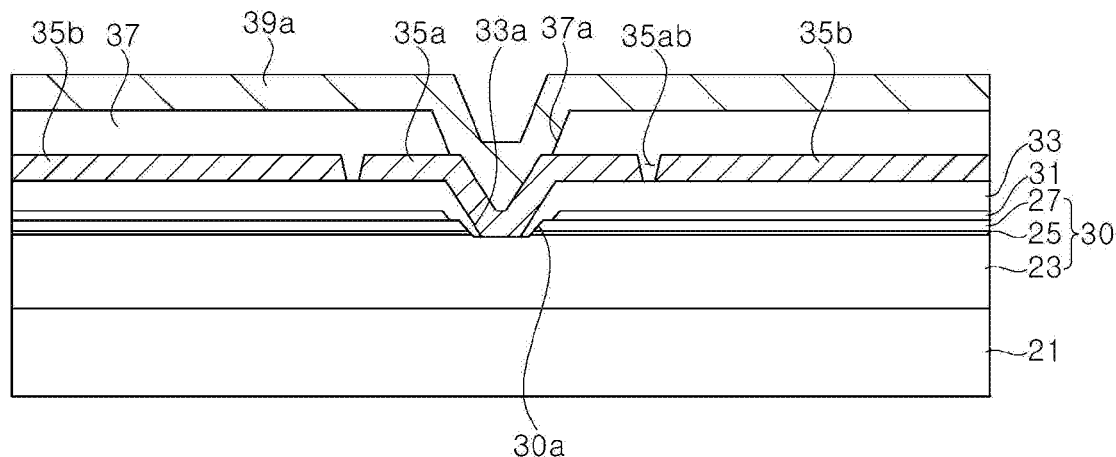
FIG. 2 is a cross-sectional view taken along the line A-A' of FIG. 1.
Figure 3:
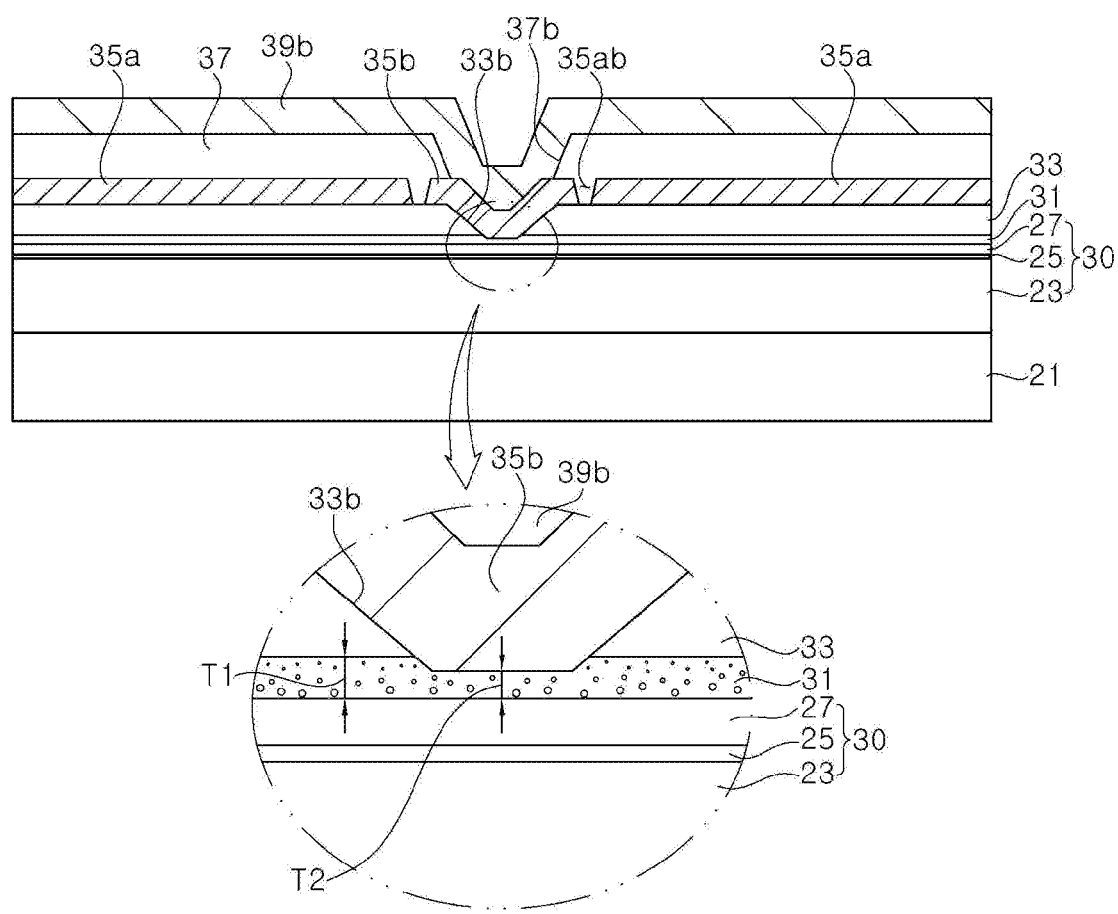
FIG. 3 is a cross-sectional view taken along the line B-B' of FIG. 1.

FIG. 1 is a schematic plan view of a light emitting diode according to one exemplary embodiment of the present disclosure, FIG. 2 is a cross-sectional view taken along the line A-A' of FIG. 1, and FIG. 3 is a cross-sectional view taken along the line B-B' of FIG. 1.

Referring to FIGS. 1 through 3, the light emitting diode includes a substrate 21, a semiconductor stack 30, a ZnO layer 31, a lower insulation layer 33, a first pad metal layer 35a, a second pad metal layer 35b, an upper insulation layer 37, a first bump pad 39a, and a second bump pad 39b. The semiconductor stack 30 includes a first conductivity type semiconductor layer 23, an active layer 25, and a second conductivity type semiconductor layer 27.

As the substrate 21, any substrate capable of growing a gallium nitride based semiconductor layer may be used without limitation. Examples of the substrate 21 include a sapphire substrate, a gallium nitride substrate, a SiC substrate, or others. The substrate 21 may be especially a patterned sapphire substrate.

The substrate 21 may have a rectangular or square shape as shown in plan view of FIG. 1, but it is not limited thereto. A size of the substrate 21 is not particularly limited and may be variously selected. The substrate 21 may be, for example, 800×800 µm$^2$ or more, especially 1,100×1100 µm$^2$.

The first conductivity type semiconductor layer 23 is disposed on the substrate 21. The first conductivity type semiconductor layer 23 may be a gallium nitride semiconductor layer grown on the substrate 21, and doped with dopants, for example, Si.

The active layer 25 and the second conductivity type semiconductor layer 27 are disposed on the first conductivity type semiconductor layer 23. The active layer 25 is interposed between the first conductivity type semiconductor layer 23 and the second conductivity type semiconductor layer 27. The active layer 25 and the second conductivity type semiconductor layer 27 may have smaller areas than the first conductivity type semiconductor layer 23. The active layer 25 and the second conductivity type semiconductor layer 27 may be formed in a mesa shape on the first conductivity type semiconductor layer 23 through mesa etching. Accordingly, a portion of an upper surface of the first conductivity type semiconductor layer 23 is exposed. For example, the first conductivity type semiconductor layer 23 may be exposed along the periphery of the mesa. In addition, the mesa may be formed in various shapes, and a region in which the first conductivity type semiconductor layer 23 is exposed may be variously modified depending on the shape of the mesa. The mesa may also have through holes 30a passing through the second conductivity type semiconductor layer 27 and the active layer 25 as shown in FIGS. 1 and 2. The through holes 30a is surrounded by the second conductivity type semiconductor layer 27 and the active layer 25. In the present embodiment, the through holes 30a have generally circular shapes, but the present disclosure is not limited thereto, but may have various shapes.

The active layer 25 may have a single quantum well structure or a multiple-quantum well structure. In the active layer 25, the compositions and thicknesses of well layers determine the wavelength of light generated in the active layer. In particular, the active layer can generate UV light, blue light or green light through adjustment of the compositions of the well layers.

The second conductivity type semiconductor layer 27 may be the gallium nitride semiconductor layer doped with p-type dopants, for example, Mg. Each of the first conductivity type semiconductor layer 23 and the second conductivity type semiconductor layer 27 may be composed of a single layer or multiple layers and may include a superlattice layer. The first conductivity type semiconductor layer 23, the active layer 25 and the second conductivity type semiconductor layer 27 may be grown on the substrate in a chamber by a well-known method, such as metal organic chemical vapor deposition (MOCVD) or molecular beam epitaxy (MBE).

The ZnO layer 31 is disposed on the second conductivity type semiconductor layer 27, and electrically connected to the second conductivity type semiconductor layer 27. The ZnO layer 31 may be disposed substantially over the entire region of the second conductivity type semiconductor layer 27 in an upper region of the second conductivity type semiconductor layer 27. Although a boundary of the ZnO layer 31 is shown as overlapping with the second conductivity type semiconductor layer 27 in FIG. 1, the boundaries thereof are not necessarily completely overlapped. That is, the boundary of the ZnO layer 31 may be located inside a region surrounded by the boundary of the second conductivity type semiconductor layer 27, and thus a region of the ZnO layer 31 may be smaller than that of the second conductivity type semiconductor layer 27.

The ZnO layer 31 may be formed through hydrothermal synthesis, and thus a lower region of the ZnO layer 31 may include more voids than an upper region thereof.

The lower insulation layer 33 covers the ZnO layer 31 and the mesa. The lower insulation layer 33 exposes a portion of the first conductivity type semiconductor layer 23. For example, the lower insulation layer 33 may expose the first conductivity type semiconductor layer 23 along the periphery of the mesa. In addition, the lower insulation layer 33 has openings 33a exposing the first conductivity type semiconductor layer 23 in the through holes 30a.

The lower insulation layer 33 also has an opening 33b exposing the ZnO layer 31. The opening 33b is disposed limitedly on the ZnO layer 31. A plurality of openings 33b may be aligned on the ZnO layer 31. A thickness T2 of the ZnO layer 31 disposed under the opening 33b of the lower insulation layer 33 is smaller than the thickness T1 of the ZnO layer 31 covered with the lower insulation layer 33. For example, the thickness T2 of the ZnO layer 31 may be smaller than the thickness T1 of the ZnO layer 31 by 40 to 100 nm. However, the thickness T2 of the ZnO layer 31 may be 100 nm or more, and thus favorable ohmic characteristics may be maintained. A maximum limit of the thickness T2 of the ZnO layer 31 is not particularly limited, and may be 500 nm or less, for example.

Since the ZnO layer 31 includes more voids in the lower region than the upper region thereof, an index of refraction of the ZnO layer 31 having the thickness T2 is smaller than that of the ZnO layer 31 having the thickness T1. As a result, a difference in the indices of refraction between the second conductivity type semiconductor layer 27 and the ZnO layer 31 under the opening 33b is greater than a difference in the indices of refraction between the second conductivity type semiconductor layer 27 and the ZnO layer 31 in another region. Therefore, among interfaces between the second conductivity type semiconductor layer 27 and the ZnO layer 31, a region under the opening 33b at which total internal reflection occurs has a smaller critical angle than in another region, and thus more total internal reflection occurs.

The lower insulation layer 33 may include silicon oxide or silicon nitride. The lower insulation layer 33 may be formed as a single layer or a multilayer. Further, the lower insulation layer 33 may include a distributed Bragg reflector in which a first material layer having a first index of refraction and a second material layer having a second index of refraction are alternately stacked. For example, to reflect blue light generated in the active layer 25, the lower insulation layer 33 may be the distributed Bragg reflector having a high reflectance in a wavelength band of 400 to 500 nm. Furthermore, to reflect not only light generated in the active layer 25 but also visible light including wavelength-converted light by a wavelength conversion layer such as a phosphor layer, the lower insulation layer 33 may be the distributed Bragg reflector with a high reflectance in a full wavelength band of about 400 to 700 nm. Herein, the first material layer may be a $SiO_2$ layer or $MgF_2$, and the second material layer may be a material layer having the index of refraction higher than that of the first material layer. The second material layer may be, for example, $TiO_2$, $Nb_2O_5$, or $ZrO_2$. Although a single first material layer and a single second material layer may be alternately stacked, the present disclosure is not limited thereto, but two or more first material layers or two or more second material layers may be used.

The first pad metal layer 35a and the second pad metal layer 35b are disposed on the lower insulation layer 33. A boundary region 35ab may be formed between the first pad metal layer 35a and the second pad metal layer 35b, and the lower insulation layer 33 is exposed in the boundary region.

The first pad metal layer 35a covers the lower insulation layer 33 while surrounding the second pad metal layer 35b and is connected to the first conductivity type semiconductor layer 23 exposed through the lower insulation layer 33. The first pad metal layer 35a may be connected to the first conductivity type semiconductor layer 23 along the periphery of the mesa, and thus current may be spread over a wide region of the first conductivity type semiconductor layer 23. In addition, the first pad metal layer 35a may be connected to the first conductivity type semiconductor layer 23 in the through holes 30a formed in the mesa. Since the first pad metal layer 35a is connected to the first conductivity type semiconductor layer 23 along the periphery of the mesa and the through holes 30a, it may improve the current spreading performance, especially in light emitting diodes of a size larger than 800×800 $\mu m^2$.

The second pad metal layer 35b is connected to the ZnO layer 31 through the openings 33b of the lower insulation layer 33. The first pad metal layer 35a and the second pad metal layer 35b may be formed of the same material by the same process in some embodiments. The present embodiment is not limited thereto and different materials or different processes may be used. In addition, as shown in the drawing, the second pad metal layer 35b may be divided and disposed into a plurality of portions. Each portion of the second pad metal layer 35b is connected to the ZnO layer 31 through the openings 33b of the lower insulation layer 33. Meanwhile, the first pad metal layer 35a may surround each of the plurality of portions of the second pad metal layer 35b. Accordingly, most of regions of the lower insulation layer 33 excluding the boundary regions 35ab are covered by the first pad metal layer 35a and the second pad metal layer 35b.

The first and second pad metal layers 35a and 35b may include an Ag layer or a reflection layer, such as an Al layer, and the reflection layer may be formed on an adhesive layer, such as a Ti layer, a Cr layer, a Ni layer or the like. In particular, in a case that the lower insulation layer 33 is formed of a transparent insulation layer such as $SiO_2$, the first and second pad metal layers 35a and 35b include a metal reflective layer. Meanwhile, a protection layer may be formed in a single layer or a multiple layer structure of Ni, Cr, or Au on the reflection layer.

Meanwhile, since the index of refraction of the ZnO layer 31 under the opening 33b is smaller than that of the ZnO layer 31 in another region, an amount of light incident on the second pad metal layer 35b passing through the ZnO layer 31 in the region under the opening 33b may be reduced. Accordingly, light loss due to the second pad metal layer 35b may be reduced.

The upper insulation layer 37 covers the first and second pad metal layers 35a and 35b. The upper insulation layer 37 also covers the boundary region 35ab between the first pad metal layer 35a and the second pad metal layer 35b. Furthermore, the upper insulation layer 37 may cover a side surface of the first pad metal layer 35a along the periphery of the mesa.

The upper insulation layer 37 has a first opening 37a exposing the first pad metal layer 35a and a second opening 37b exposing the second pad metal layer 35b. The upper insulation layer 37 may have a plurality of first openings 37a and a plurality of second openings 37b. The first opening 37a may be disposed so as to overlap with the through hole 30a and the opening 33a of the lower insulation layer, and the second opening 37b may be disposed so as to overlap with the opening 33b of the lower insulation layer 33. However, the present disclosure is not limited thereto, the first opening 37a and the second opening 37b may be laterally spaced apart from the openings 33a and 33b of the lower insulation layer 33.

Meanwhile, the upper insulation layer 37 covers the side surface of the first pad metal layer 35a to prevent the side surface of the first pad metal layer 35a from being exposed. The upper insulation layer 37 may be formed to cover all of first conductivity type semiconductor layer 23 disposed along the periphery of the mesa or may be formed to expose the first conductivity type semiconductor layer 23.

The upper insulation layer 37 may be formed in a single layer of $SiO_2$ or $Si_3N_4$. In particular, the upper insulation layer 37 may be formed in the single layer of $Si_3N_4$.

The first bump pad 39a may be electrically connected to the first pad metal layer 35a exposed through the first opening 37a of the upper insulation layer 37, and the second bump pad 39b may be electrically connected to the second pad metal layer 35b exposed through the second opening 37b. The first bump pad 39a covers and seals all of the first opening 37a of the upper insulation layer 37, and the second bump pad 39b covers and seals all of the second opening 37b of the upper insulation layer 37.

The first bump pad 39a and the second bump pad 39b may be formed over the plurality of portions of the second pad metal layer 35b as shown in FIG. 1. In this structure, it is possible to easily spread the current over a wide region of the light emitting diode through the second pad metal layer 35b.

The first bump pad 39a and the second bump pad 39b may be formed of solder or AuSn.

Hereinafter, a structure of the light emitting diode will be described more clearly through a method of manufacturing of the light emitting diode described below.

Figure 4A:
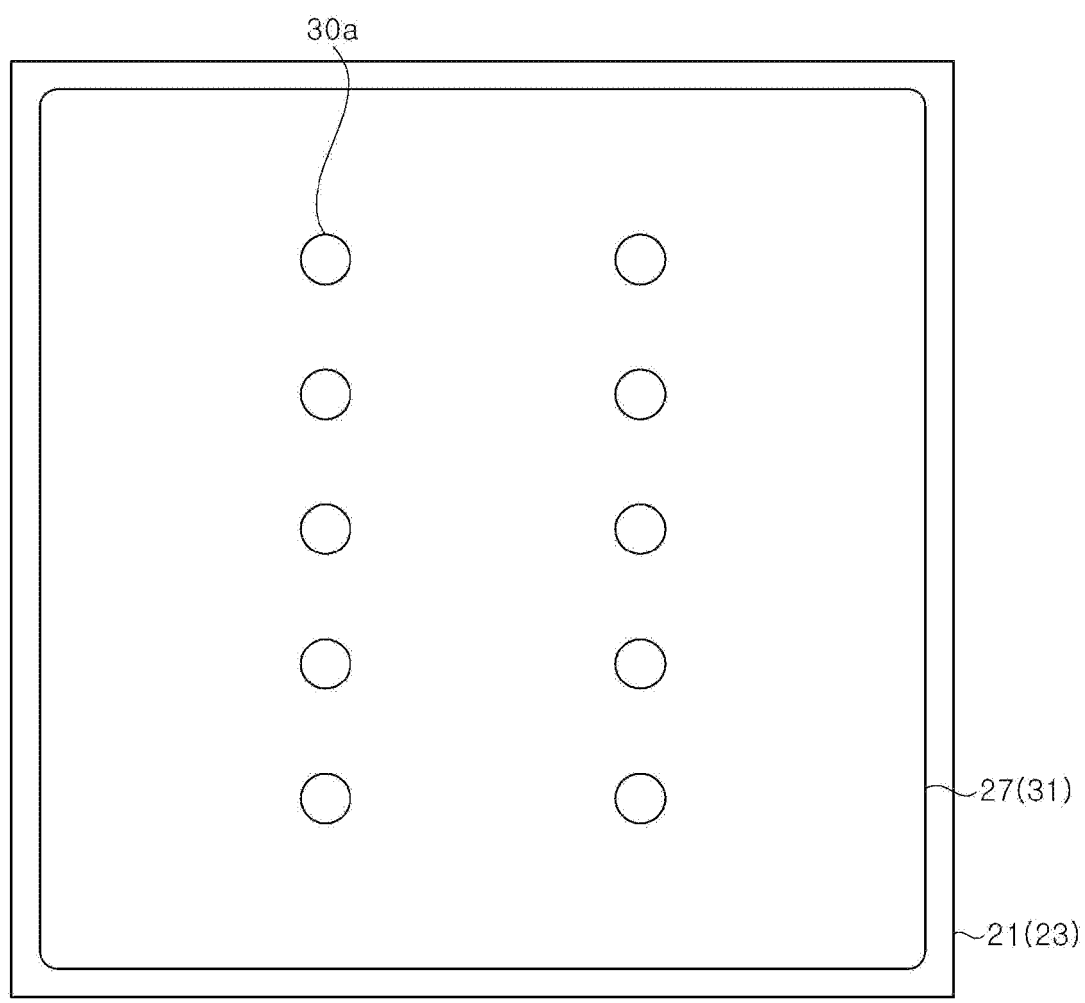
FIG. 4A is a plan view illustrating a method of manufacturing the light emitting diode according to one exemplary embodiment of the present disclosure.
Figure 4B:
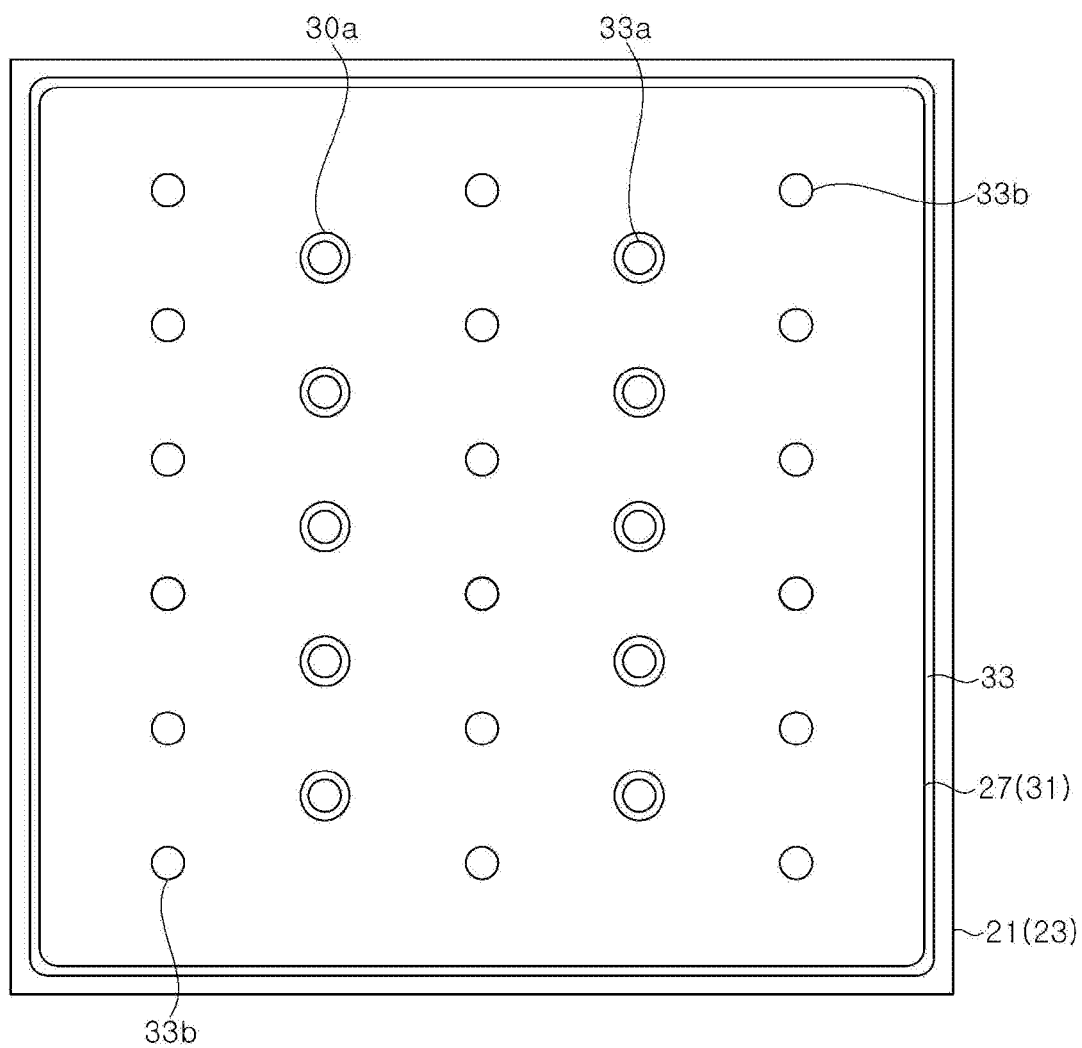
FIG. 4B is a plan view illustrating the method of manufacturing the light emitting diode as shown in FIG. 4A which further includes forming openings exposing a first conductivity type semiconductor layer and a lower insulation layer.
Figure 4C:
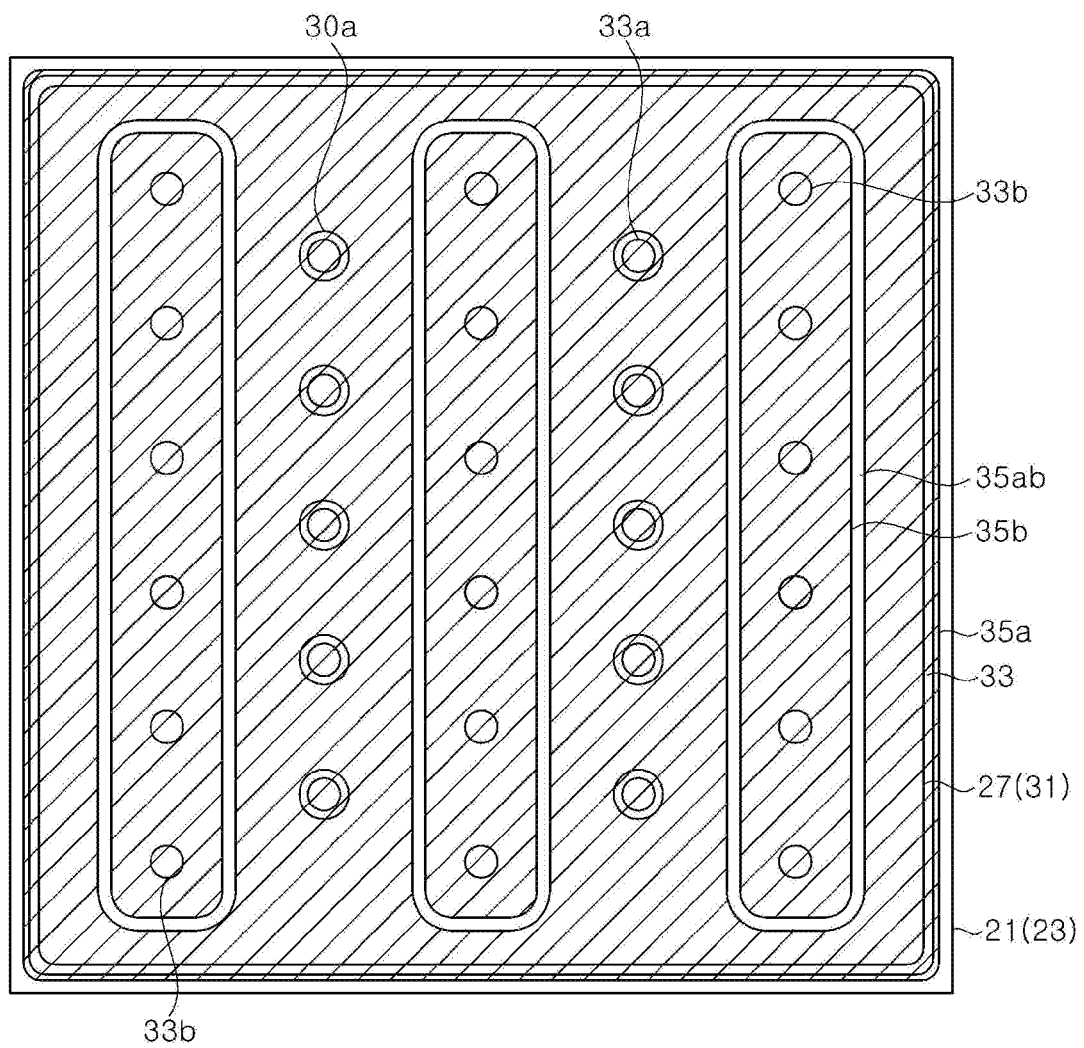
FIG. 4C is a plan view illustrating the method of manufacturing the light emitting diode as shown in FIG. 4B which further includes forming a first pad metal layer and a second pad metal layer.
Figure 4D:
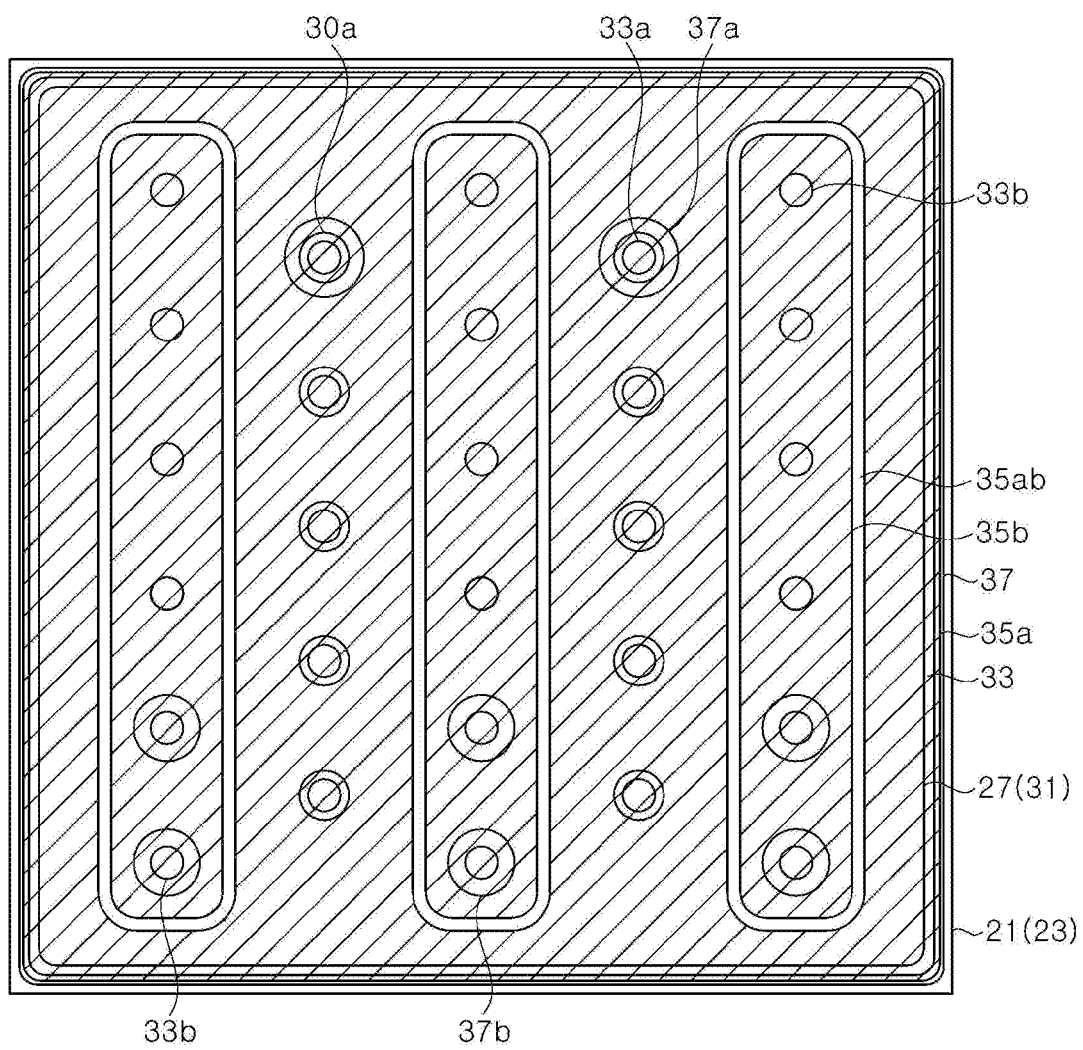
FIG. 4D is a plan view illustrating the method of manufacturing the light emitting diode as shown in FIG. 4C which further includes forming an upper insulation layer covering the first pad metal layer and the second pad metal layer.
Figure 4E:
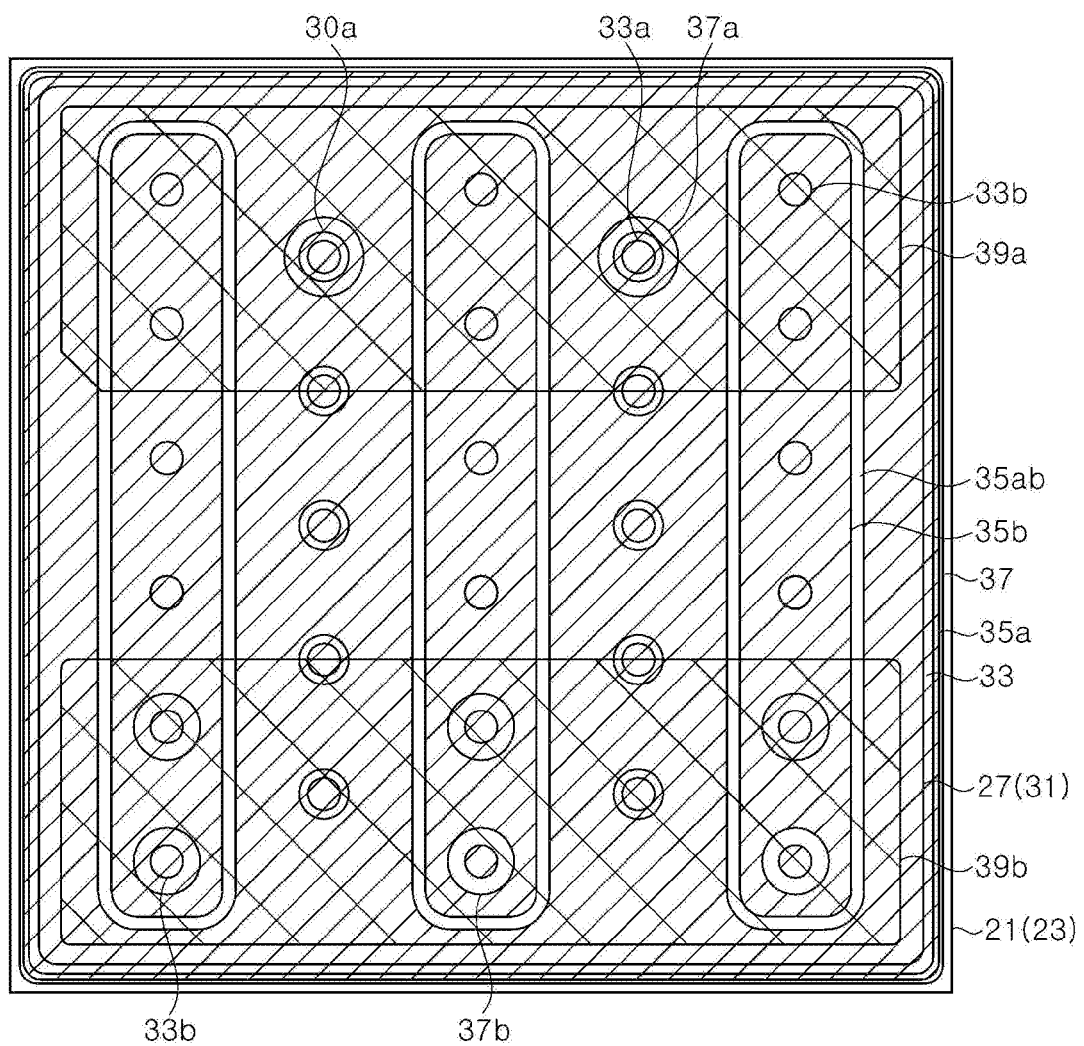
FIG. 4E is a plan view illustrating the method of manufacturing the light emitting diode as shown in FIG. 4D which further includes forming a first bump pad and a second bump pad formed on the upper insulation layer.

FIGS. 4A through 4E are plan views illustrating the method of manufacturing the light emitting diode according to one exemplary embodiment of the present disclosure. In particular, FIG. 4B is a plan view illustrating the method of manufacturing the light emitting diode as shown in FIG. 4A which further includes forming openings exposing a first conductivity type semiconductor layer and a lower insulation layer. FIG. 4C is a plan view illustrating the method of manufacturing the light emitting diode as shown in FIG. 4B which further includes forming a first pad metal layer and a second pad metal layer. FIG. 4D is a plan view illustrating the method of manufacturing the light emitting diode as shown in FIG. 4C which further includes forming an upper insulation layer covering the first pad metal layer and the second pad metal layer. FIG. 4E is a plan view illustrating the method of manufacturing the light emitting diode as shown in FIG. 4D which further includes forming a first bump pad and a second bump pad formed on the upper insulation layer.

First, referring to FIGS. 2, 3, and 4A, the semiconductor stack 30 including the first conductivity type semiconductor layer 23, the active layer 25 and the second conductivity type semiconductor layer 27 is grown on the substrate 21. The substrate 21 is not particularly limited as long as it can grow the gallium nitride based semiconductor layer.

The first conductivity type semiconductor layer 23 may include, for example, an n-type gallium nitride layer, and the second conductivity type semiconductor layer 27 may include a p-type gallium nitride layer. Meanwhile, the active layer 25 may have a single quantum well structure or a multiple-quantum well structure, and may include a well layer and a barrier layer. The composition of the well layer may be determined depending upon the wavelength of light to be emitted and may include, for example, AlGaN, GaN, or InGaN.

Subsequently, the ZnO layer 31 is formed on the semiconductor stack 30. The ZnO layer 31 may be formed through hydrothermal synthesis using a seed layer on the second conductivity type semiconductor layer 27 after the second conductivity type semiconductor layer 27 is grown. That is, the ZnO seed layer may be formed first on the second conductivity type semiconductor layer 27, and a ZnO bulk layer may be formed thereon through hydrothermal synthesis. The ZnO seed layer may be formed by the hydrothermal synthesis method, a sputtering method, a sol-gel method, or the like. Accordingly, the ZnO layer 31 may be formed of a continuous single crystal in a form of a film, and thus it is possible to provide a transparent electrode layer having a very low light absorption. Particularly, in a structure where the ZnO seed layer is formed by the sol-gel method, interface characteristics between the ZnO layer 31 and the second conductivity type semiconductor layer 27 may be improved, thereby lowering the forward voltage of the light emitting diode.

For example, the ZnO layer 31 may be formed through hydrothermal synthesis using a solution containing a ZnO precursor, and the ZnO layer 31 formed through hydrothermal synthesis may be heated at a temperature of about 200 to 300° C. in $N_2$ atmosphere. A sheet resistance of the ZnO layer 31 may be reduced through the heat treatment, and a light transmittance may be improved. Due to the low light absorption, the ZnO layer 31 may be formed in a relatively large thickness, for example, in a range of about 1000 Å to about 1 μm.

Meanwhile, the ZnO layer 31 may include a dopant. The ZnO layer 31 may include a metallic dopant, and may include at least one from, for example, silver(Ag), indium (In), tin(Sn), zinc(Zn), cadmium(Cd), gallium(Ga), aluminum(Al), magnesium(Mg), titanium(Ti), molybdenum(Mo), nickel(Ni), copper(Cu), gold(Au), platinum(Pt), rhodium (Rh), iridium(Ir), ruthenium(Ru), palladium(Pd), and the like. In one embodiment, the ZnO layer 31 may be formed of Ga-doped ZnO(GZO). In a structure where the metallic dopant in the ZnO layer 31 is included, the sheet resistance may be further lowered, and thus it is possible to evenly spread the current in the horizontal direction. However, the present disclosure is not limited thereto, the ZnO layer 31 may be formed of undoped ZnO.

After the ZnO layer 31 is formed, the ZnO layer 31 and the semiconductor stack 30 are patterned to form the mesa. In FIG. 4A, reference numeral 27(31) denotes a boundary region of the mesa, and reference numeral 30a denotes the through holes 30a passing through the second conductivity type semiconductor layer 27 and the active layer 25 and exposing the first conductivity type semiconductor layer 23.

The ZnO layer 31 may be patterned by wet etching using a photoresist pattern, and the second conductivity type semiconductor layer 27 and the active layer 25 may be dry etched using the same photoresist pattern to form the mesa and the through holes 30a at the same time. Since the ZnO layer 31 is patterned by wet etching, the boundary of the ZnO layer 31 may be located closer to an inside than that of the second conductivity type semiconductor layer 27.

Meanwhile, the upper surface of the first conductivity type semiconductor layer 23 is partially exposed along the periphery of the mesa. The through holes 30a may be disposed in various portions of the mesa to improve current spreading.

Referring to FIGS. 2, 3, and 4B, the lower insulation layer 33 covering the ZnO layer 31 and the mesa is formed. In particular, the lower insulation layer 33 covers a side surface of the mesa, thereby preventing the second conductivity type semiconductor layer 27 and the active layer 23 from being exposed.

The lower insulation layer 33 may be formed of the transparent insulation layer or the distributed Bragg reflector. The lower insulation layer 33 may be formed by using a technique such as a chemical vapor deposition technique or an electron beam evaporation technique.

Meanwhile, the lower insulation layer 33 may be patterned using photolithography and etching techniques. The openings 33a exposing the first conductivity type semiconductor layer 23 in the through holes 30a and the openings 33b exposing the ZnO layer 31 are formed by patterning the lower insulation layer 33, and the first conductivity type semiconductor layer 23 is exposed along the periphery of the mesa. In FIG. 4B, the first conductivity type semiconductor layer 23 is continuously exposed in a ring shape along the periphery of the mesa, but the present disclosure is not limited thereto, the mesa may be exposed at a plurality of portions intermittently around the mesa.

However, since the ZnO layer 31 is vulnerable to an acidic solution, the lower insulation layer 33 is patterned by using dry etching technique instead of wet etching. Meanwhile, the thickness of the ZnO layer 31 exposed under the openings 33b of the lower insulation layer 33 becomes smaller as the lower insulation layer 33 is over-etched. The thickness T2 of the ZnO layer under the lower insulation layer 33 may be approximately 40 to 100 nm smaller than the thickness T1 of the unetched ZnO layer 31 covered with the lower insulation layer 33. However, the thickness T2 of the ZnO layer under the openings 33b may be maintained to be approximately 100 to 500 nm, thereby ensuring favorable ohmic characteristics.

Referring to FIGS. 2, 3, and 4C, the first pad metal layer 35a and the second pad metal layer 35b are formed on the lower insulation layer 33.

The first pad metal layer 35a is electrically connected to the first conductivity type semiconductor layer 23 exposed through the lower insulation layer 33. For example, the first pad metal layer 35a is connected to the first conductivity type semiconductor layer 23 exposed along the periphery of the mesa, and is also connected to the first conductivity type semiconductor layer 23 exposed through the openings 33a in the through holes 30a. The first pad metal layer 35a may be continuous as shown, but it is not limited thereto, and may be divided into a plurality of portions.

The first pad metal layer 35a may be formed over a wide region to easily spread the current in the light emitting diode.

The second pad metal layer 35b covers the openings 33b of the lower insulation layer 33 and is connected to the ZnO layer 31. The second pad metal layer 35b may include a plurality of portions spaced from one another. Each of the plurality of portions of the second pad metal layer 35b is connected to the ZnO layer 31. Although the second pad metal layer 35b is shown to be divided into the plurality of portions in this embodiment, it is not limited thereto, but a single relatively large second pad metal layer 35b may cover all of the plurality of openings 33b.

The boundary region 35ab is formed between the first pad metal layer 35a and the second pad metal layer 35b, and the lower insulation layer 33 is exposed to the boundary region 35ab.

The first pad metal layer 35a and the second pad metal layer 35b may be formed of the same material in the same process at the same time. For example, the first and second pad metal layers 35a and 35b may be formed by using a lift-off technique.

The first pad metal layer 35a and the second pad metal layer 35b may include Ti, Cr, Ni or the like as an adhesive layer, and Ag or Al as a metal reflective layer. Furthermore, the first pad metal layer 35a and the second pad metal layer 35b may include Au as an oxidation preventing layer. The first pad metal layer 35a and the second pad metal layer 35b may be formed of a material such as Cr(25 Å)/Al(1200 Å)/Ni(1000 Å)/Ti(1000 Å)/Ni(1000 Å)/Ti(1000 Å)/Au(2 μm)/Ti(100 Å).

Referring to FIGS. 2, 3, and 4D, the upper insulation layer 37 covering the first pad metal layer 35a and the second pad metal layer 35b is formed. The upper insulation layer 37 also covers the first conductivity type semiconductor layer 23 along the periphery of the mesa. The upper insulation layer 37 may be formed of an insulation layer such as $SiO_2$ or $Si_3N_4$, and protects the first and second pad metal layers 35a and 35b.

The upper insulation layer 37 may be patterned by using photolithography and etching techniques, and accordingly, the first openings 37a exposing the first pad metal layer 35a and the second openings 37b exposing the second pad metal layer 35b are formed. Furthermore, the upper insulation layer 37 may be removed along the periphery of the mesa and the first conductivity type semiconductor layer 23 or the substrate 21 may be exposed to an edge portion of the substrate 21.

As shown in FIG. 4D, the first openings 37a and the second openings 37b are disposed opposite to each other in the upper region of the mesa. For example, the first openings 37a are disposed near an upper edge, and the second openings 37b are disposed near a lower edge.

Referring to FIGS. 2, 3, and 4E, the first bump pad 39a and the second bump pad 39b are formed on the upper insulation layer 37, and the substrate 21 is divided to complete the light emitting diode as shown in FIGS. 1 through 3. The upper insulation layer 37 in a scribing line portion for dividing the substrate 21 may be removed in advance, and accordingly, the upper surface of the first conductivity type semiconductor layer 23 or the substrate 21 may be exposed at an edge of the light emitting diode.

The first bump pad 39a is electrically connected to the first pad metal layer 35a through the opening 37a of the upper insulation layer 37, and the second bump pad 39b is electrically connected to the second pad metal layer 35b through the opening 37b of the upper insulation layer 37.

The first and second bump pads 39a and 39b may be formed by using the lift-off technique, for example, using AuSn or solder.

Figure 5:
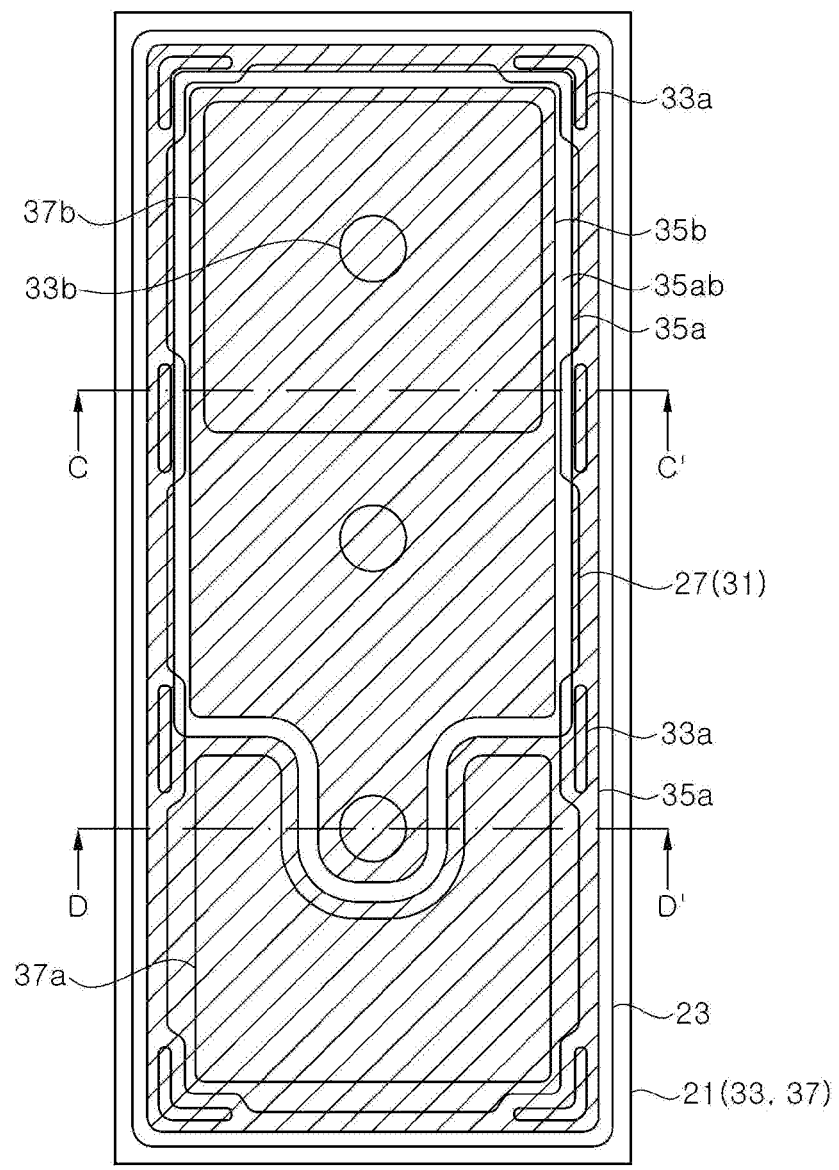
FIG. 5 is a schematic plan view of a light emitting diode according to another exemplary embodiment of the present disclosure.
Figure 6:
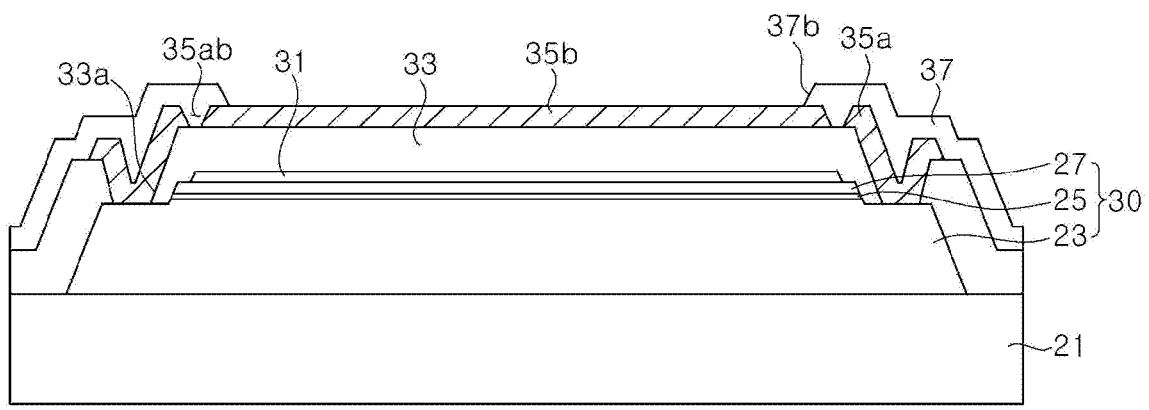
FIG. 6 is a cross-sectional view taken along the line C-C' of FIG. 5.
Figure 7:
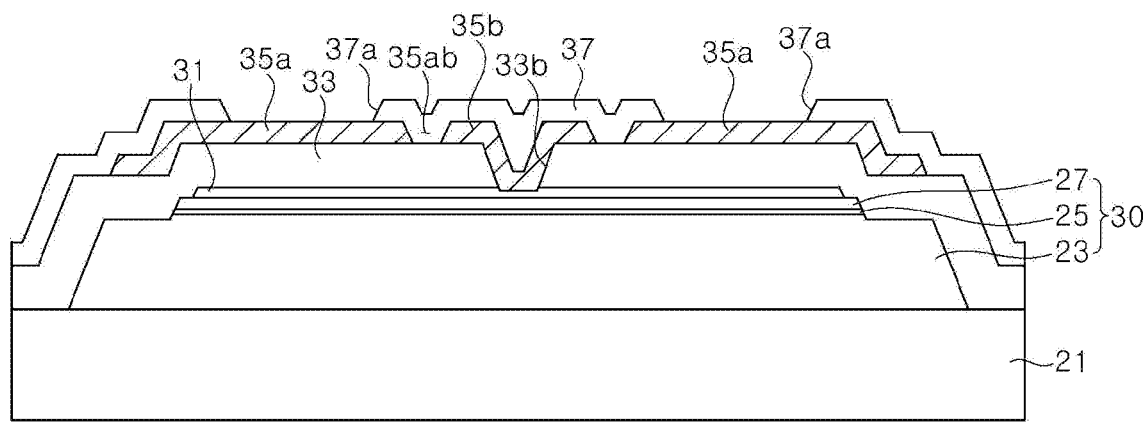
FIG. 7 is a cross-sectional view taken along the line D-D' of FIG. 5.

FIG. 5 is a schematic plan view of a light emitting diode according to another exemplary embodiment of the present disclosure, FIG. 6 is a cross-sectional view taken along the line C-C' of FIG. 5, and FIG. 7 is a cross-sectional view taken along the line D-D' of FIG. 5.

Referring to FIGS. 5, 6, and 7, the light emitting diode according to this embodiment is substantially similar to the light emitting diode described with reference to FIGS. 1 through 3 except that shapes of the light emitting diode and mesa, locations of the openings 33a and 33b of the lower insulation layer 33, and shapes of the openings 37a and 37b of the upper insulation layer 37 are different, and further, the first and second bump pads 39a and 39b are omitted in this embodiment. Hereinafter, differences from the embodiments described above will be mainly described.

First, the light emitting diode according to the present embodiment is a compact light emitting diode having a major axis direction and a minor axis direction, and a length of the light emitting diode in the major axis direction is 600 μm or less. For example, the light emitting diode may have a size of, for example, 540×240 μm$^2$.

Although an edge of the substrate 21 and an edge of the first conductivity type semiconductor layer 23 are shown to be aligned with each other in the embodiment above, the edge of the first conductivity type semiconductor layer 23 in this embodiment is located inside a region surrounded by the edge of the substrate 21.

Meanwhile, the mesa is located on the first conductivity type semiconductor layer 23, and the ZnO layer 31 is disposed on the mesa. Reference numeral 27(31) indicates an outline of the mesa. As described above, the boundary of the ZnO layer 31 may be located inside the second conductivity type semiconductor layer 27.

The mesa has a long rectangular shape, but a plurality of groove portions is formed on the side surface thereof. However, in this embodiment, the through holes (30a in FIG. 1) surrounded by the second conductivity type semiconductor layer 27 and the active layer 25 are omitted.

Meanwhile, the lower insulation layer 33 has openings 33a and 33b, and the openings 33a are intermittently arranged along the periphery of the mesa. The openings 33a are disposed near the side surfaces of the mesa along the major axis direction and may also be disposed near four corners of the mesa. The openings 33a may have elongated shapes, and are disposed near the groove portions of the mesa.

The openings 33b are disposed in the upper region of the mesa, and expose the ZnO layer 31. The openings 33b may be arranged on a center line along the major axis direction of the light emitting diode. In a structure where the openings 33a are arranged on the side surfaces of the mesa and the openings 33b are arranged on the center line, it is possible to evenly spread the currents in the light emitting diode.

A first pad metal layer 35a and a second pad metal layer 35b are disposed on the lower insulation layer 33, and the first pad metal layer 35a surrounds the second pad metal layer 35b. In this embodiment, a single second pad metal layer 35b is disposed in the upper region of the mesa and connected to the ZnO layer 31 through openings 33b. The first pad metal layer 35a surrounds the second pad metal layer 35b, and the first pad metal layer 35a covers the openings 33a of the lower insulation layer 33 and is electrically connected to the first conductivity type semiconductor layer 23.

Meanwhile, the second pad metal layer 35b may include a protrusion protruding along the major axis direction, and one of the openings 33b of the lower insulation layer 33 may be disposed under the protrusion. The first pad metal layer 35a may have a groove portion for receiving the second pad metal layer 35b. That is, the first pad metal layer 35a may have a shape where the groove portion of the first pad metal layer 35a and the protrusion of the second pad metal layer 35b are interlocked with each other. This shape is advantageous in ensuring a sufficient region of the first pad.

The upper insulation layer 37 covers the first pad metal layer 35a and the second pad metal layer 35b, and has a first opening 37a and a second opening 37b for exposing the first pad metal layer 35a and the second pad metal layer 35b, respectively. In this embodiment, the first opening 37a and the second opening 37b may define a first pad region and a second pad region, and thus have relatively large sizes. In particular, the first opening 37a defining the first pad region has a shape enclosing the protrusion of the second pad metal layer 35b as shown in FIG. 5.

In this embodiment, bump pads are omitted, and the first and second pad metal layers 35a and 35b exposed through the openings 37a and 37b of the upper insulation layer 37 function as the bonding pads.

Figure 8A:
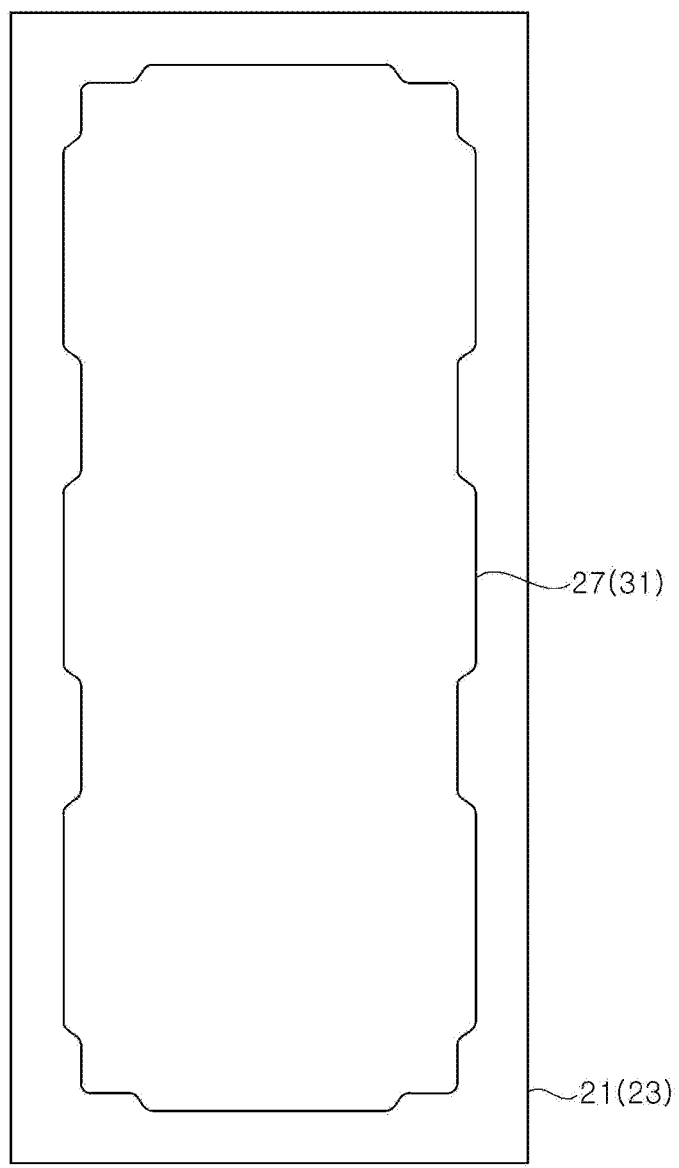
FIG. 8A is a plan view illustrating a method of manufacturing the light emitting diode according to another exemplary embodiment of the present disclosure.
Figure 8B:
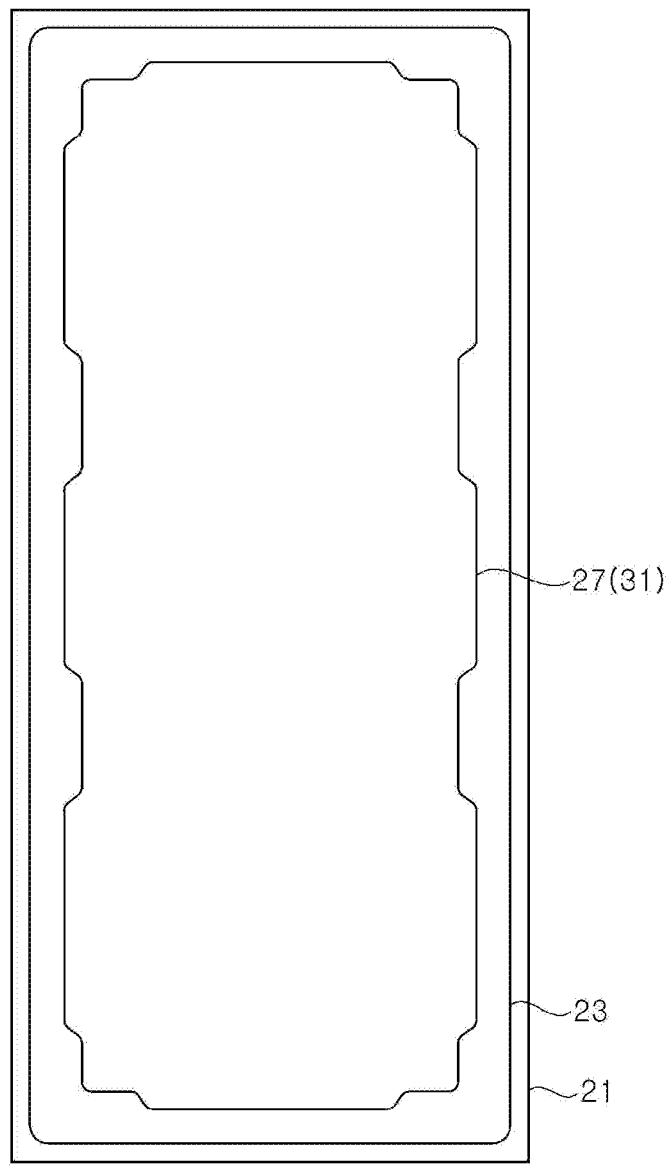
FIG. 8B is a plan view illustrating the method of manufacturing the light emitting diode as shown in FIG. 8A which further includes an isolation process that exposes a first conductivity type semiconductor layer.
Figure 8C:
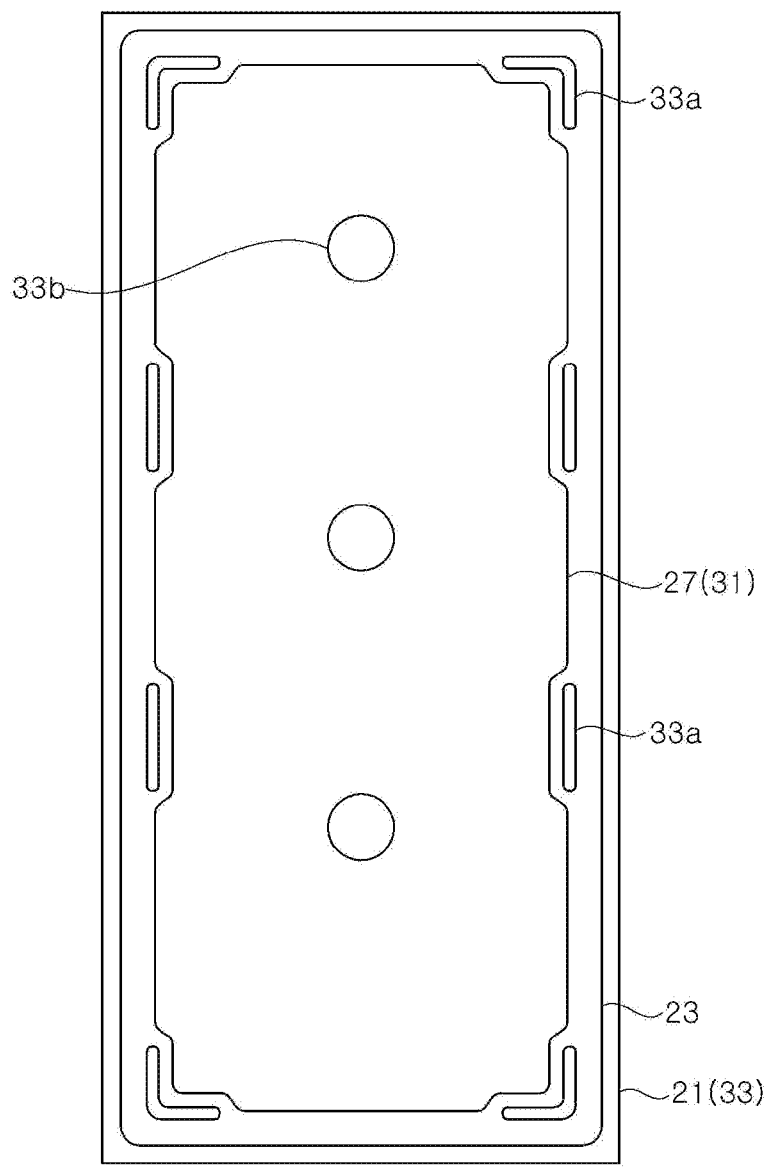
FIG. 8C is a plan view illustrating the method of manufacturing the light emitting diode as shown in FIG. 8B which further includes forming openings.
Figure 8D:
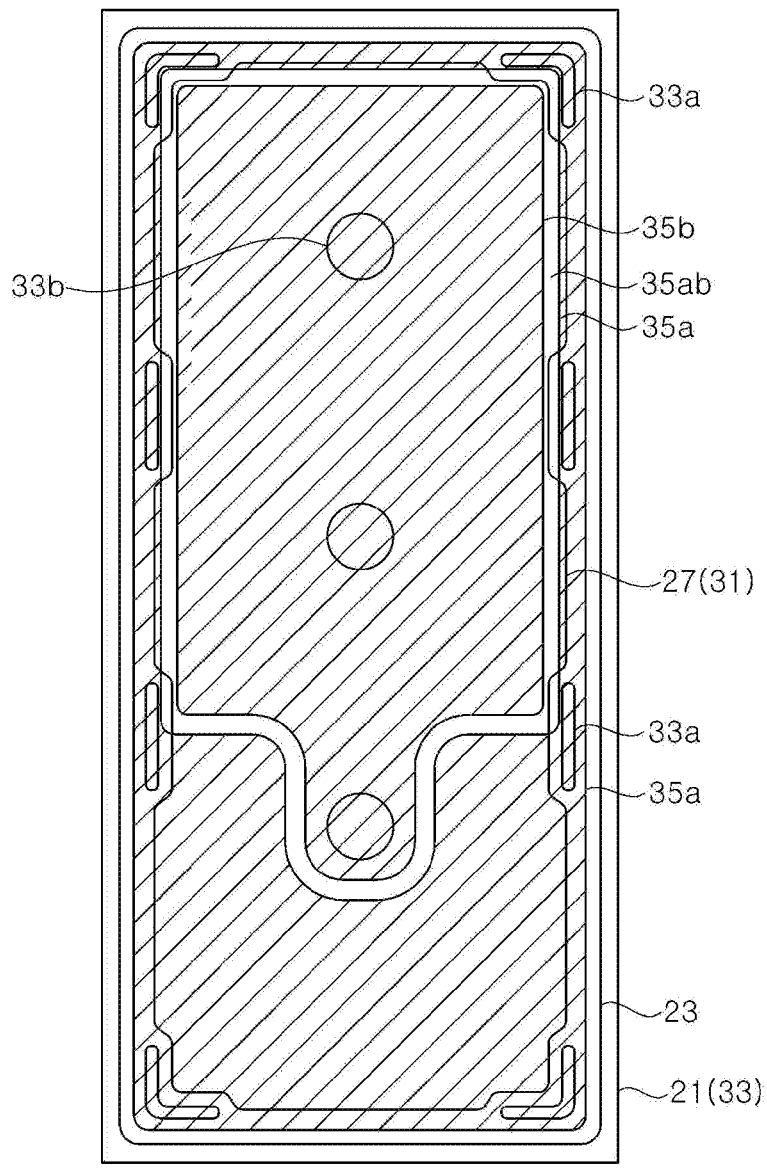
FIG. 8D is a plan view illustrating the method of manufacturing the light emitting diode as shown in FIG. 8C which further includes forming a first pad metal layer and a second pad metal layer.
Figure 8E:
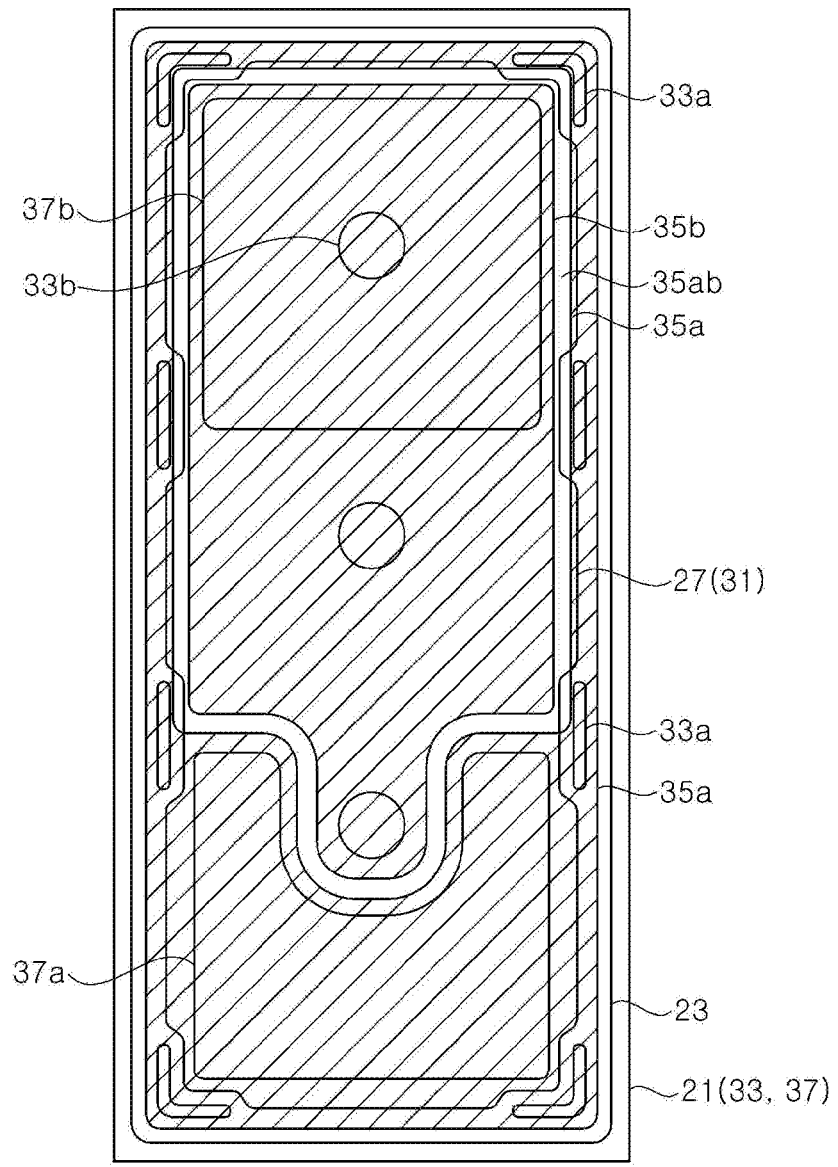
FIG. 8E is a plan view illustrating the method of manufacturing the light emitting diode as shown in FIG. 8D which further includes forming an upper insulation layer.

FIGS. 8A and 8E are plan views illustrating a method of manufacturing the light emitting diode described with reference to FIGS. 5 through 7. FIG. 8A is a plan view illustrating a method of manufacturing the light emitting diode according to another exemplary embodiment of the present disclosure. FIG. 8B is a plan view illustrating the method of manufacturing the light emitting diode as shown in FIG. 8A which further includes an isolation process that exposes a first conductivity type semiconductor layer. FIG. 8C is a plan view illustrating the method of manufacturing the light emitting diode as shown in FIG. 8B which further includes forming openings. FIG. 8D is a plan view illustrating the method of manufacturing the light emitting diode as shown in FIG. 8C which further includes forming a first pad metal layer and a second pad metal layer. FIG. 8E is a plan view illustrating the method of manufacturing the light emitting diode as shown in FIG. 8D which further includes forming an upper insulation layer.

The method of manufacturing the light emitting diode according to the present embodiment is substantially similar to that of the light emitting diode described with reference to FIG. 4, and thus a detailed description thereof will be omitted.

Referring to FIGS. 6, 7, and 8A, as described with FIG. 4A, the semiconductor stack 30 is formed on the substrate 21, the ZnO layer 31 is formed thereon, and the mesa is formed by patterning the ZnO layer 31, the second conductivity type semiconductor layer 27 and the active layer 25.

The mesa is formed to have a plurality of groove portions on the side surfaces along the major axis direction. Inwardly recessed regions are also formed at the four corners of the mesa.

Referring to FIGS. 6, 7, and 8B, the first conductivity type semiconductor layer 23 exposed at the periphery of the mesa is patterned to expose the substrate 21. This process is generally referred to as an isolation process. Although it has been illustrated and described in the previous embodiment that the first conductivity type semiconductor layer 23 covers an entire surface of the substrate 21 without performing the isolation process, the isolation process is performed to expose the edge of the substrate 21 in this embodiment.

Referring to FIGS. 6, 7, and 8C, the lower insulation layer 33 is deposited and patterned using photolithography and dry etching techniques to form the openings 33a and 33b. The lower insulation layer 33 also covers the first conductivity type semiconductor layer 23 and the substrate 21 exposed around the mesa, however, the openings 33a which expose the first conductivity type semiconductor layer 23 are formed in regions corresponding to the groove portions of the mesa. Meanwhile, the openings 33b are formed on the ZnO layer 31 and expose the ZnO layer 31.

Referring to FIGS. 6, 7, and 8D, the first pad metal layer 35a and the second pad metal layer 35b are formed on the lower insulation layer 33. The first pad metal layer 35a is connected to the first conductivity type semiconductor layer 23 through the openings 33a of the lower insulation layer 33, and the second pad metal layer 35b is connected to the ZnO layer 31 through the openings 33b.

In this embodiment, the lower insulation layer 33 is exposed to the outside of the first pad metal layer 35a.

Referring to FIGS. 6, 7, and 8E, the upper insulation layer 37 covering the first pad metal layer 35a and the second pad metal layer 35b is formed. The upper insulation layer 37 covers an edge of the first pad metal layer 35a, and covers the lower insulation layer 37 exposed to the outside of the first pad metal layer 35a.

The upper insulation layer 37 may be patterned by using photolithography and etching techniques, and accordingly, the first openings 37a exposing the first pad metal layer 35a and the second openings 37b exposing the second pad metal layer 35b are formed.

Subsequently, the light emitting diode is completed by dividing the substrate 21.

Figure 9:
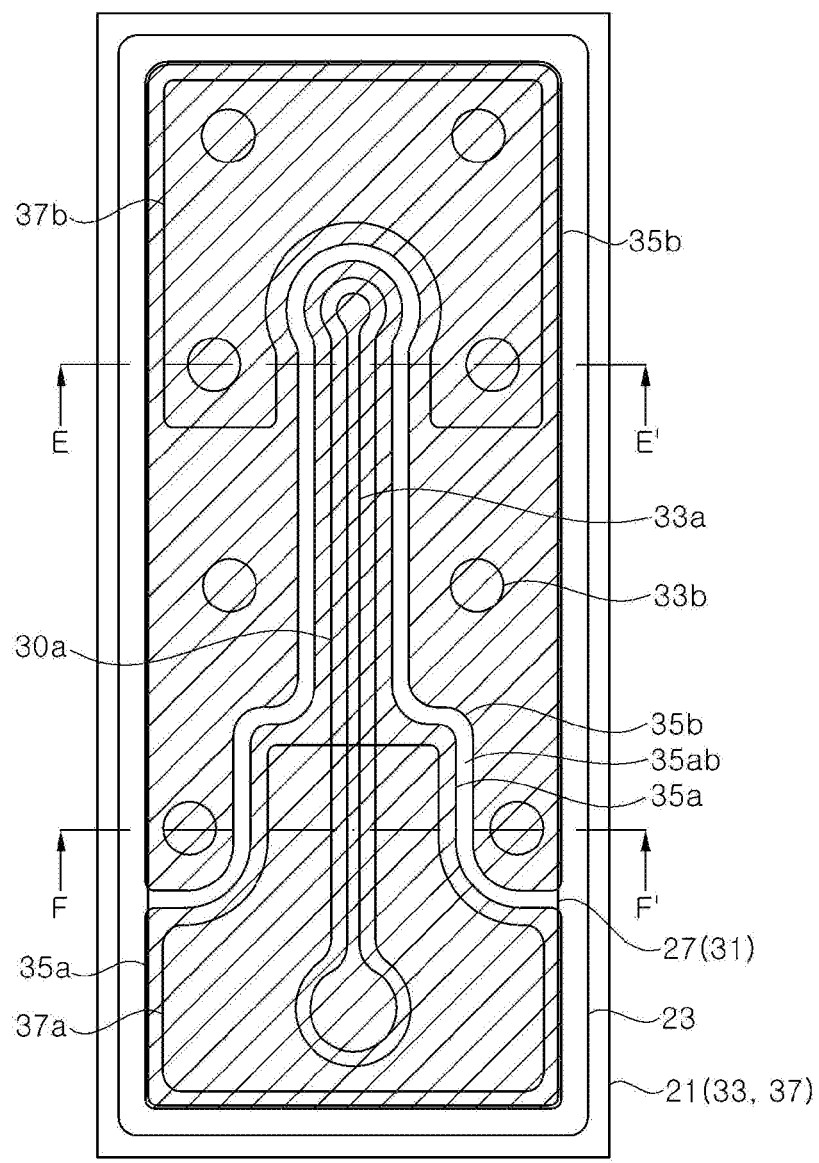
FIG. 9 is a schematic plan view of a light emitting diode according to another exemplary embodiment of the present disclosure.
Figure 10:
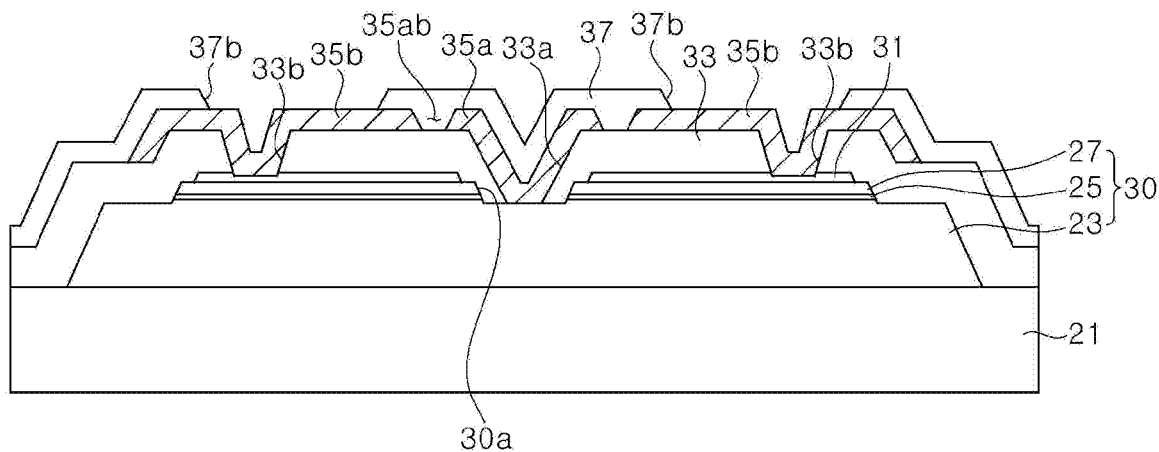
FIG. 10 is a cross-sectional view taken along the line E-E' of FIG. 9.
Figure 11:
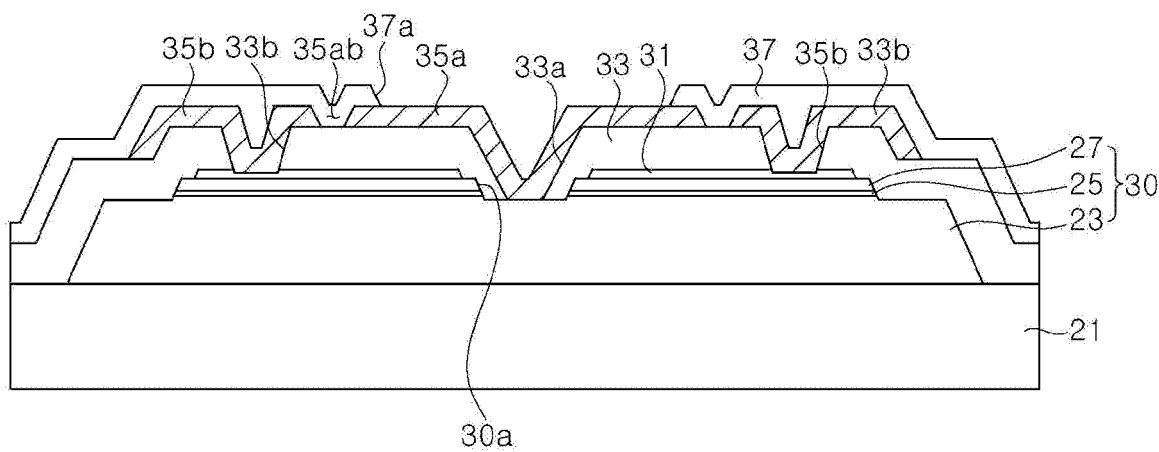
FIG. 11 is a cross-sectional view taken along the line F-F' of FIG. 9.

FIG. 9 is a schematic plan view of a light emitting diode according to another exemplary embodiment of the present disclosure, FIG. 10 is a cross-sectional view taken along the line E-E' of FIG. 9, and FIG. 11 is a cross-sectional view taken along the line F-F' of FIG. 9.

Referring to FIGS. 9, 10, and 11, the light emitting diode according to this embodiment is substantially similar to the light emitting diode described above with reference to FIGS. 6 through 8 except that the first pad metal layer 35a is connected to the first conductivity type semiconductor layer 23 in the through hole 30a instead of being connected to the first conductivity type semiconductor layer 23 along the periphery of the mesa have.

A mesa is formed to have a rectangular shape with smooth side surfaces, and through hole 30a passing through the second conductivity type semiconductor layer 27 and the active layer 23 to expose the first conductivity type semiconductor layer 23 is formed. In this embodiment, the through hole 30a has an elongated shape along the major axis direction of the light emitting diode, but the present disclosure is not limited thereto, a plurality of through holes 30a may be arranged along the major axis direction.

The ZnO layer 31 is disposed on the mesa, and the ZnO layer 31 has the same shape as the mesa.

The lower insulation layer 33 covers the ZnO layer 31, and the mesa, and also covers the first conductivity type semiconductor layer 23 and the substrate 21 which are exposed around the mesa. The lower insulation layer 33 has openings 33a exposing the first conductivity type semiconductor layer 23 in the through hole 30, and also has openings 33b exposing the ZnO layer 31. The opening 33a is formed in a shape similar to that of the through hole 30a, and the openings 33b are disposed around the through hole 30a.

The first pad metal layer 35a is connected to the first conductivity type semiconductor layer 23 exposed in the through hole 30a, and the second pad metal layer 35b is connected to the ZnO layer 33b exposed to the openings 33b. In this embodiment, the first pad metal layer 35a does not surround the second pad metal layer 35b. Also, the first pad metal layer 35a includes a narrow and elongated protruding region, and the second pad metal layer 35b has a concave portion receiving the narrow and elongated region of the first pad metal layer 35a.

The upper insulation layer 37 covers the first and second pad metal layers 35a and 35b, and covers the lower insulation layer 33 exposed around the mesa. The upper insulation layer 37 has a first opening 37a exposing the first pad metal layer 35a and a second opening 37b exposing the second pad metal layer 35b, and the first opening 37a and the second opening 37b define a first pad region and a second pad region, respectively.

In this embodiment, the second pad region has a shape surrounding the first pad metal layer 35a, and the first pad region includes a protruding region along the major axis direction.

Figure 12A:
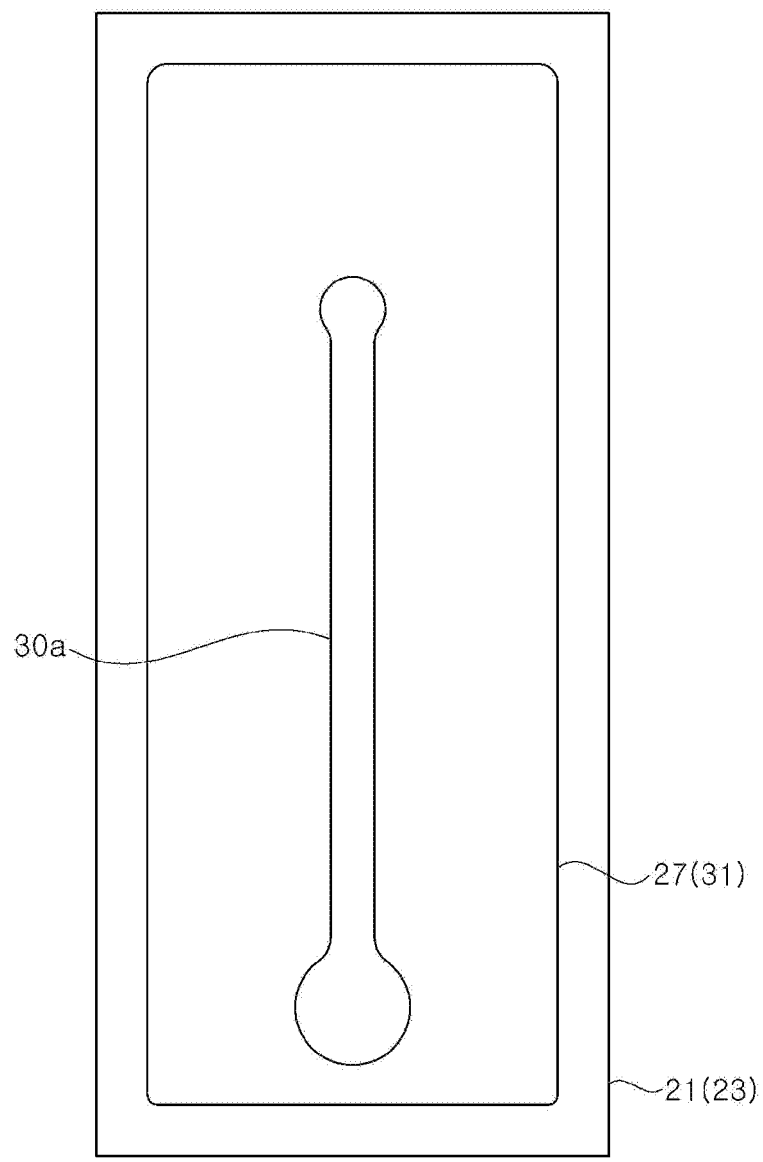
FIG. 12A is a plan view illustrating a method of manufacturing the light emitting diode according to another exemplary embodiment of the present disclosure.
Figure 12B:
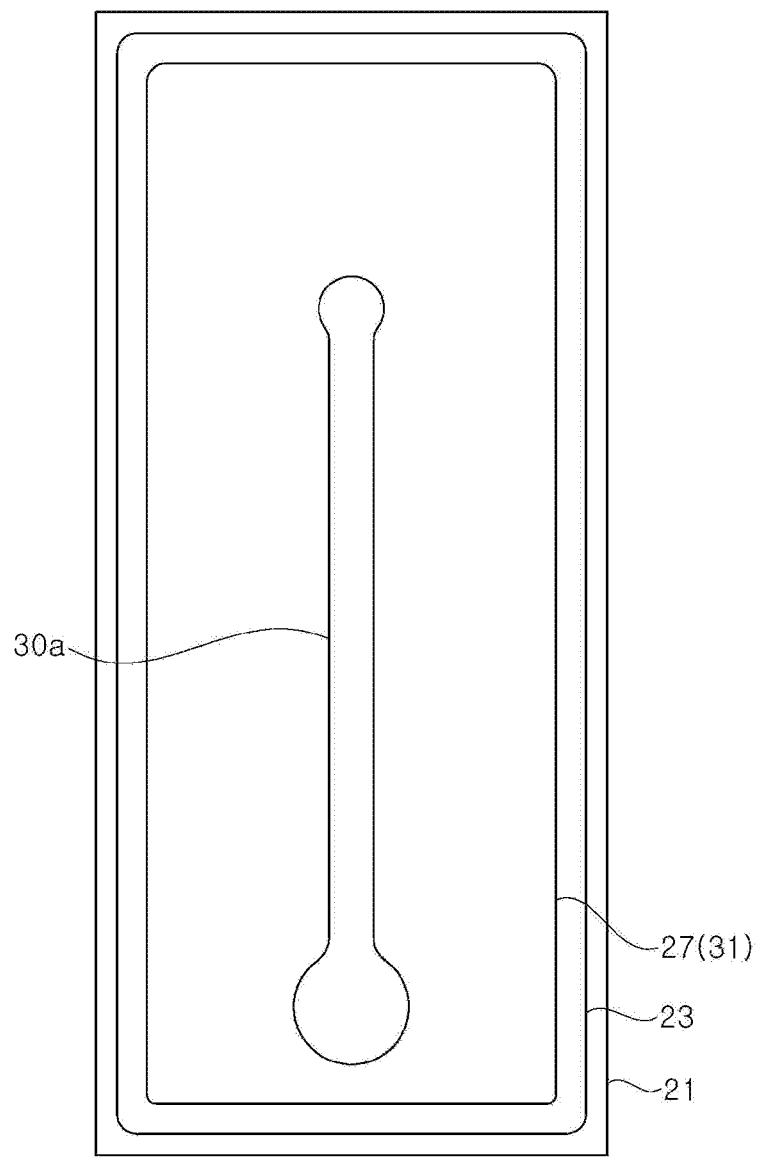
FIG. 12B is a plan view illustrating the method of manufacturing the light emitting diode as shown in FIG. 12A which further includes an isolation process.
Figure 12C:
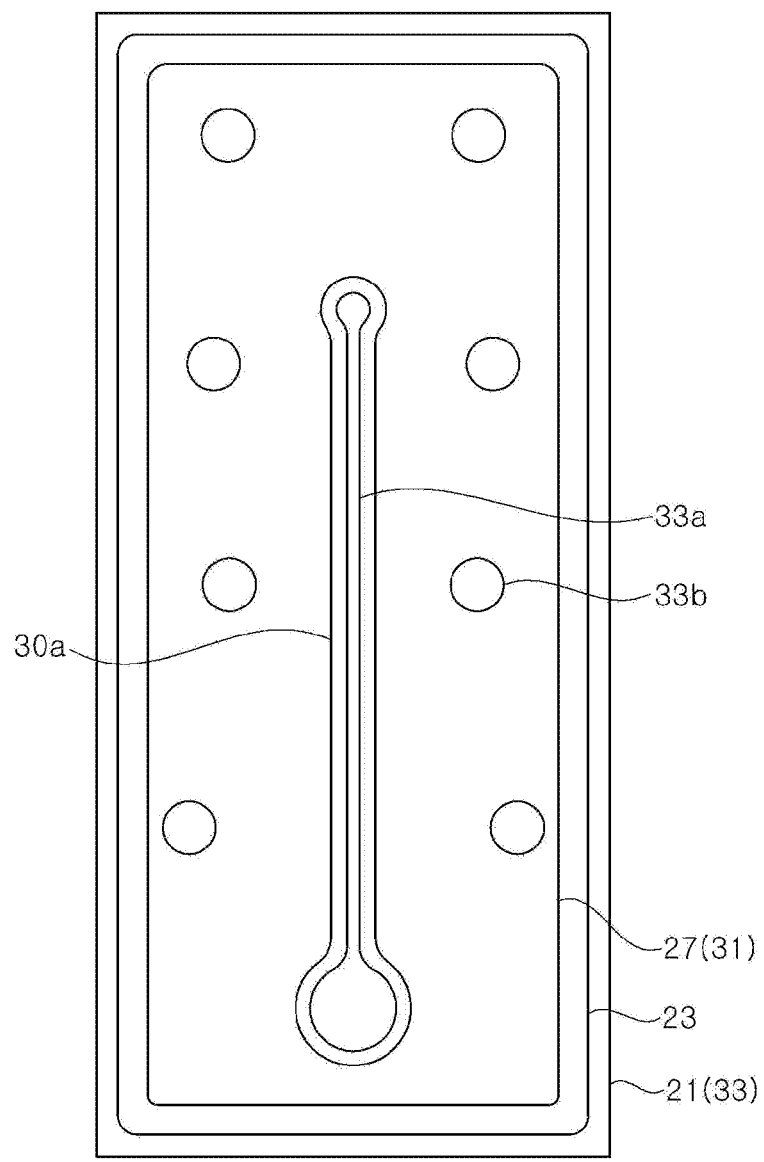
FIG. 12C is a plan view illustrating the method of manufacturing the light emitting diode as shown in FIG. 12B which further includes forming openings.
Figure 12D:
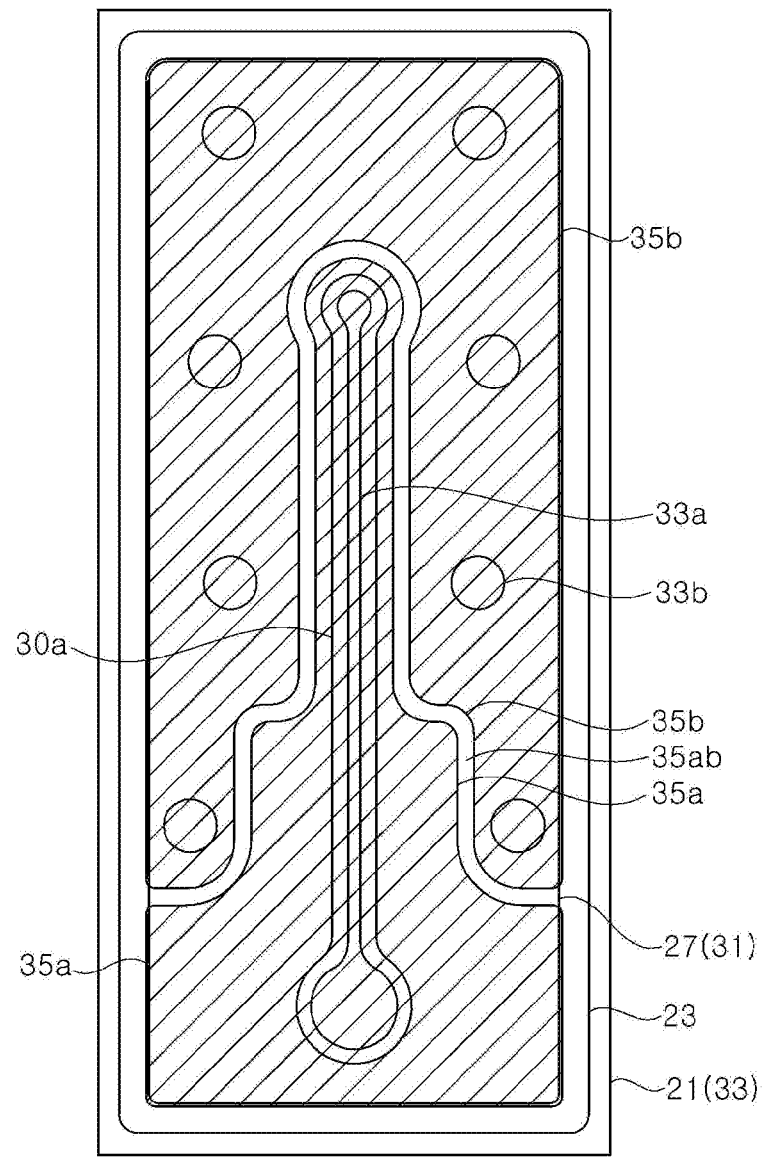
FIG. 12D is a plan view illustrating the method of manufacturing the light emitting diode as shown in FIG. 12C which further includes forming a first pad metal layer and a second pad metal layer.
Figure 12E:
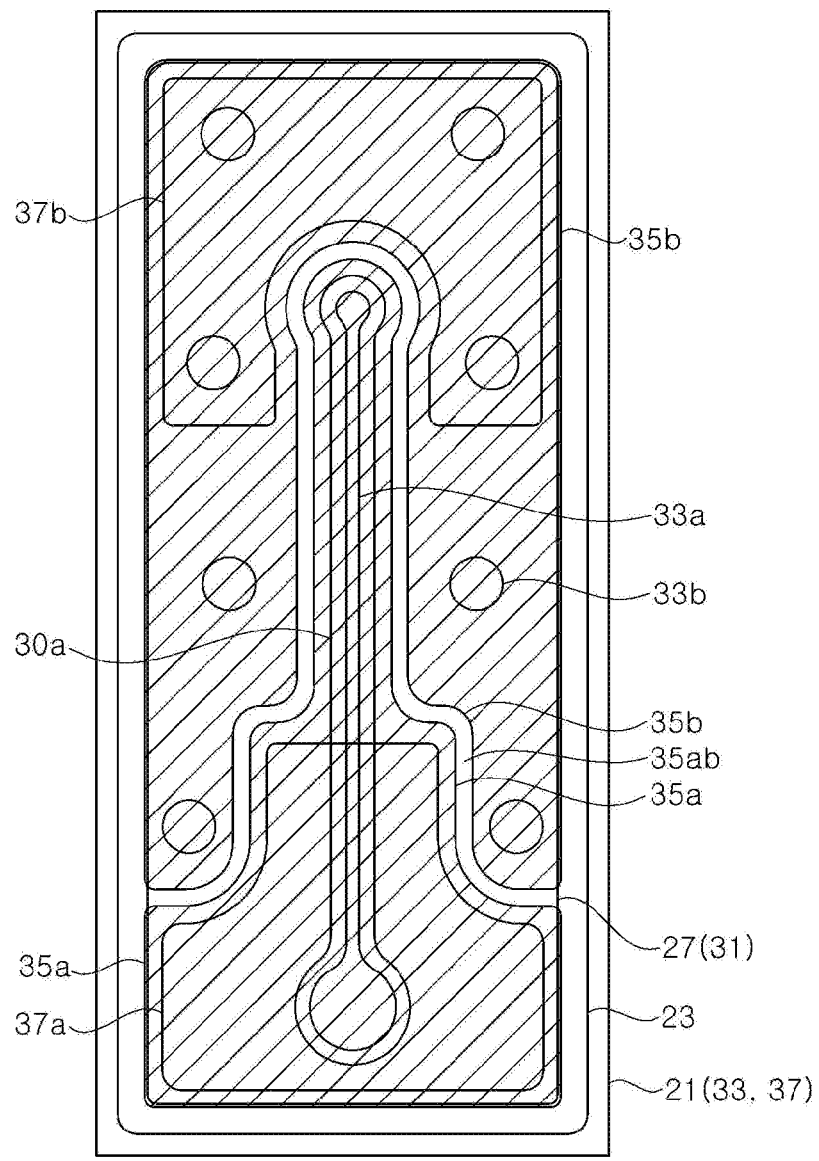
FIG. 12E is a plan view illustrating the method of manufacturing the light emitting diode as shown in FIG. 12D which further includes forming an upper insulation layer covering the first pad metal layer and the second pad metal layer.

FIGS. 12A through 12E are schematic plan views illustrating a method of manufacturing the light emitting diode described with reference to FIGS. 9 through 11. FIG. 12A is a plan view illustrating a method of manufacturing the light emitting diode according to another exemplary embodiment of the present disclosure. FIG. 12B is a plan view illustrating the method of manufacturing the light emitting diode as shown in FIG. 12A which further includes an isolation process. FIG. 12C is a plan view illustrating the method of manufacturing the light emitting diode as shown in FIG. 12B which further includes forming openings. FIG. 12D is a plan view illustrating the method of manufacturing the light emitting diode as shown in FIG. 12C which further includes forming a first pad metal layer and a second pad metal layer. FIG. 12E is a plan view illustrating the method of manufacturing the light emitting diode as shown in FIG. 12D which further includes forming an upper insulation layer covering the first pad metal layer and the second pad metal layer.

The method of manufacturing the light emitting diode according to the present embodiment is substantially similar to that described with reference to FIG. 8, but the mesa is formed to have the through hole 30a.

Referring to FIGS. 10, 11, and 12A, the semiconductor stack 30 is formed on the substrate 21, the ZnO layer 31 is formed thereon, and the mesa is formed by patterning the ZnO layer 31, the second conductivity type semiconductor layer 27 and the active layer 25.

The side surfaces of the mesa may be formed to be smooth, and has the through hole 30a inside having the elongated shape along the major axis direction. The through holes 30a is surrounded by the second conductivity type semiconductor layer 27 and the active layer 25. Both ends of the through hole 30a in the longitudinal direction have rounded shapes. Meanwhile, to sufficiently ensure a size of the second pad region, the end of the through hole 30a close to the second pad region may be formed to be relatively small.

Referring to FIGS. 10, 11, and 12B, the substrate 21 is exposed by patterning the first conductivity type semiconductor layer 23 exposed around the mesa through an isolation process.

Referring to FIGS. 10, 11, and 12C, subsequently, the lower insulation layer 33 is deposited and patterned using photolithography and dry etching techniques to form the openings 33a and 33b. The lower insulation layer 33 also covers the first conductivity type semiconductor layer 23 and the substrate 21 exposed around the mesa. The opening 33a exposes the first conductivity type semiconductor layer 23 in the through hole 30a, and the openings 33b are formed in an upper region of the ZnO layer 31 and expose the ZnO layer 31.

Referring to FIGS. 10, 11, and 12D, the first pad metal layer 35a and the second pad metal layer 35b are formed on the lower insulation layer 33. The first pad metal layer 35a is connected to the first conductivity type semiconductor layer 23 through the opening 33a of the lower insulation layer 33, and the second pad metal layer 35b is connected to the ZnO layer 31 through the openings 33b.

In this embodiment, the lower insulation layer 33 is exposed to the outsides of the first pad metal layer 35a and the second pad metal layer 35b. Further, in this embodiment, the first pad metal layer 35a and the second pad metal layer 35b are laterally spaced from each other by the boundary region 35ab, and the first pad metal layer 35a does not surround the second pad metal layer 35b. However, the present disclosure does not limited thereto, the first pad metal layer 35a may surround the second pad metal layer 35b, or the second pad metal layer 35b may surround the first pad metal layer 35a.

Referring to FIGS. 10, 11, and 12E, the upper insulation layer 37 covering the first pad metal layer 35a and the second pad metal layer 35b is formed. The upper insulation layer 37 covers edges of the first pad metal layer 35a and the second pad metal layer 35b, and covers the lower insulation layer 37 exposed to the outside of the first pad metal layer 35a.

The upper insulation layer 37 may be patterned by using photolithography and etching techniques, and accordingly, the first openings 37a exposing the first pad metal layer 35a and the second openings 37b exposing the second pad metal layer 35b are formed.

Subsequently, the light emitting diode is completed by dividing the substrate 21.

Figure 13:
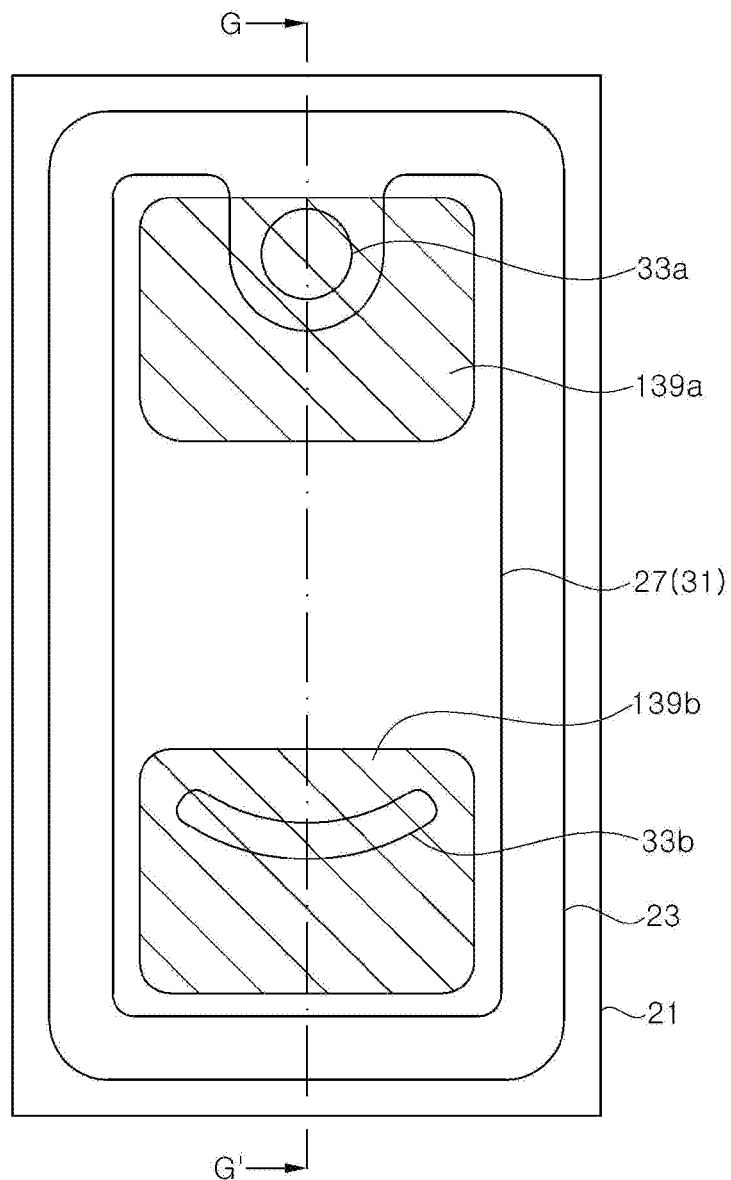
FIG. 13 is a schematic plan view of a light emitting diode according to another exemplary embodiment of the present disclosure.
Figure 14:
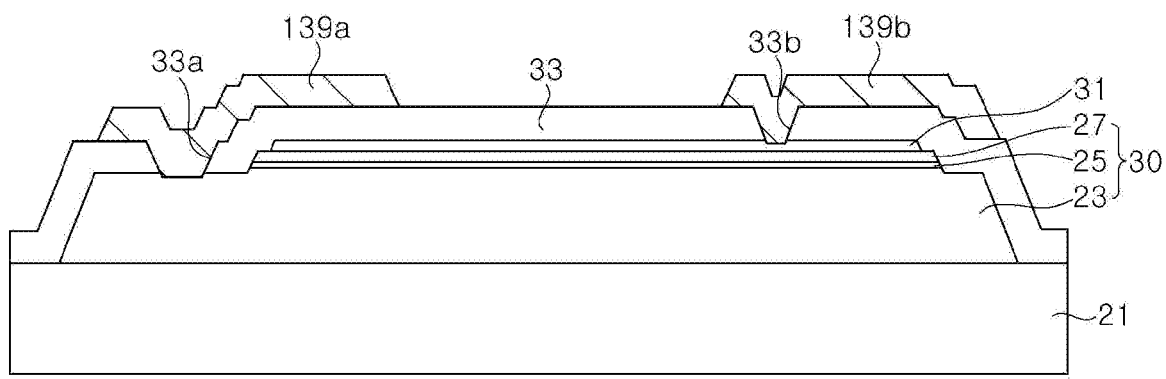
FIG. 14 is a cross-sectional view taken along the line G-G' of FIG. 13.

FIG. 13 is a schematic plan view of a light emitting diode according to another exemplary embodiment of the present disclosure, and FIG. 14 is a cross-sectional view taken along the line G-G' of FIG. 13.

Referring to FIGS. 13 and 14, the light emitting diode according to this embodiment is substantially similar to the light emitting diode described above with reference to FIGS. 1 through 3 except that the first pad metal layer 35a and the second pad metal layer 35b are omitted. Hereinafter, differences from the embodiments described above will be mainly described.

First, the light emitting diode according to the present embodiment is a compact light emitting diode having a major axis direction and a minor axis direction, and a length of the light emitting diode in the major axis direction is 600 µm or less.

In addition, in this embodiment, an edge of the first conductivity type semiconductor layer 23 may be located inside a region surrounded by the edge of the substrate 21.

Meanwhile, a mesa is located on the first conductivity type semiconductor layer 23, and a ZnO layer 31 is disposed on the mesa. Reference numeral 27(31) indicates an outline of the mesa. The ZnO layer 31 may have a similar shape in plan view to that of the second conductivity type semiconductor layer 31. As shown in FIG. 14, a boundary of the ZnO layer 31 may be located inside the second conductivity type semiconductor layer 27.

The mesa generally has a long rectangular shape along the substrate 21, and may have an indentation to expose the first conductivity type semiconductor layer 23. However, the present embodiment is not limited thereto, and a through hole surrounded by the second conductivity type semiconductor layer 27 and the active layer 25 may be formed in the mesa.

The lower insulation layer 33 covers the mesa and the ZnO layer 31. Further the lower insulation layer 33 may cover the first conductivity type semiconductor layer 23 and the substrate 21. The lower insulation layer 33 has openings 33a and 33b, the opening 33a exposes the first conductivity type semiconductor layer 23, and the opening 33b exposes the ZnO layer 31 on the mesa. As shown in the drawing, the openings 33a and 33b may be disposed opposite to each other along the major axis direction.

The lower insulation layer 33 may be formed of various materials and structures as described above, and in particular, may be formed of the distributed Bragg reflector. In addition, as described with FIG. 3, the thickness of the ZnO layer 31 located under the opening 33b of the lower insulation layer 33 is smaller than that of the ZnO layer covered with the lower insulation layer 33. Since the lower region of the ZnO layer 31 includes more voids than the upper region thereof, the index of refraction of the ZnO layer 31 located under the opening 33b becomes smaller than that of the ZnO layer 31 in another region. Accordingly, a total amount of light incident on the ZnO layer 31 through the lower region of the opening 33b may be reduced by using the total internal reflection, and thus light loss due to the second bump pad 139b may be reduced.

A first bump pad 139a and a second bump pad 139b are directly disposed on the lower insulation layer 33. That is, the first pad metal layer 35a and the second pad metal layer 35b mentioned in the previous embodiments are omitted. The upper insulation layer 37 may also be omitted.

As shown in FIG. 13, widths of the first bump pad 139a and the second bump pad 139b may be smaller than that of the mesa. Also, the second bump pad 139b may be disposed within an upper region of the mesa without being limited thereto.

According to this embodiment, in a structure where the first pad metal layer and the second pad metal layer are omitted, it is possible to provide the light emitting diode having a simpler structure.

The light emitting diodes according to the embodiments described above can be used for various applications: for example, various kinds of applications such as a large-scale natural color flat panel display, a traffic light, an indoor lighting, a vehicular head light, a high density light source, a high resolution output system, optical communication, or the like. In particular, the compact light emitting diodes described with reference to FIGS. 5 through 7, FIGS. 9 through 11, or FIGS. 13 and 14 may be usefully used for filament LED bulbs or the like. Conventionally, light emitting diodes used in filament LED bulbs are electrically connected by using bonding wires, where wires may be disconnected and defective in a case that the filaments are bent (not flat), or flexible filaments. However, since the light emitting diodes according to the present embodiment may be bonded to the filament by flip-chip bonding without bonding wires, it is possible to prevent the occurrence of electrical disconnection.

Figure 15:
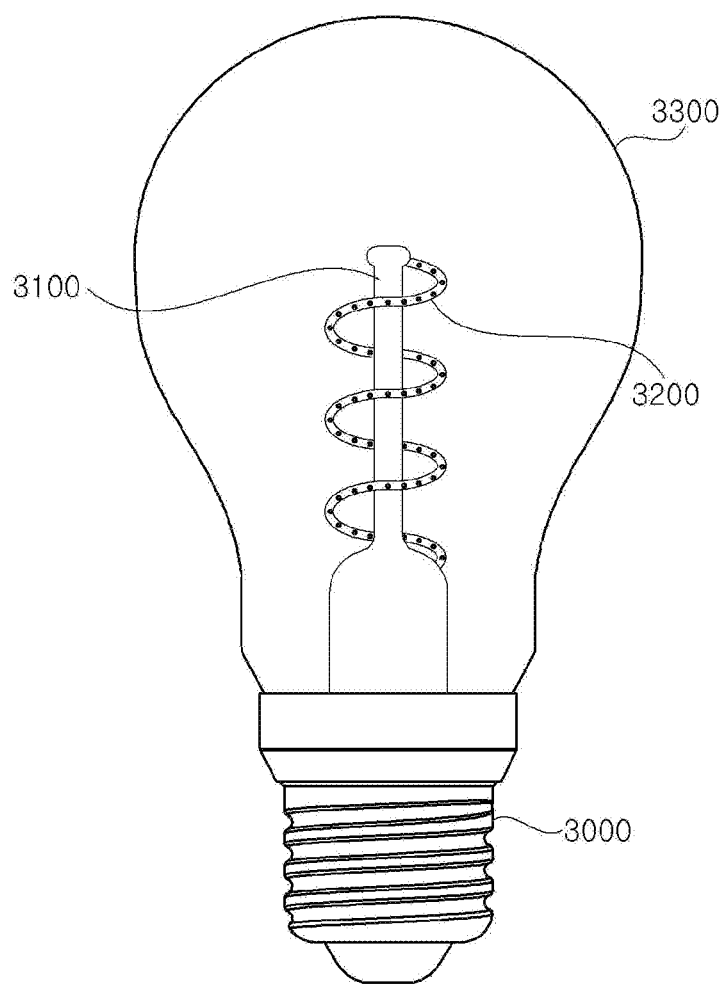
FIG. 15 is a schematic cross-sectional view of an LED lamp according to one exemplary embodiment of the present disclosure.

FIG. 15 is a schematic cross-sectional view of an LED lamp according to one exemplary embodiment of the present disclosure.

Referring to FIG. 15, the LED lamp includes a bulb base 3000, a central pillar 3100, an LED filament 3200, and a transparent bulb 3300.

The bulb base 3000 has the same electrode structure as that used in a conventional bulb. In addition, passive and active devices such as an AC/DC converter may be included inside the bulb base 3000.

Since the bulb base 3000 has the same electrode structure as that of the conventional bulb, a conventional socket can be used for the LED lamp according to the embodiments of the present disclosure. Therefore, it is possible to save an installation cost of an additional facility by using the use of the LED lamp.

The center pillar 3100 is fixed to the bulb base 3000 and disposed at a center of the LED lamp. The center pillar 3100 may include a pedestal, a post, and an upper end. The center pillar 3100 is for supporting the LED filament 3200, and may be formed of, for example, glass.

The LED filament 3200 includes a base, a conductive wiring and a light emitting diode as a flexible light strap. The light emitting diode is the compact light emitting diode described above with reference to FIGS. 5 through 7, FIGS. 9 through 11, or FIGS. 13 and 14. Since the LED filament 3200 is formed of the flexible light strap, a shape of the LED filament 3200 may be variously modified. Particularly, since the compact light emitting diode is bonded to the conductive wiring through the flip chip bonding, defects such as wire disconnection are prevented even if the shape of the LED filament 3200 is variously modified.

Meanwhile, the LED filament 3200 may be electrically connected to the electrode of the bulb base 3000 through lead wires (not shown).

The light transparent bulb 3300 surrounds the LED filament 3200 and separates it from an external environment. The transparent bulb 3300 may be formed of glass or plastic. The transparent bulb 3300 may have various shapes, and may have the same shape as the conventional bulb.

Although some exemplary embodiments have been described herein, it should be understood that these embodiments are provided for illustration only and are not to be construed in any way as limiting the present disclosure. It should be understood that features or components of one exemplary embodiment may also be applied to other exemplary embodiments without departing from the spirit and scope of the present disclosure.

We claim:

1. A light emitting diode, comprising:
   a first conductivity type semiconductor layer and a mesa disposed on the first conductivity type semiconductor layer wherein the mesa is a semiconductor stack including an active layer and a second conductivity type semiconductor layer;
   a ZnO layer disposed on the second conductivity type semiconductor layer;
   a lower insulation layer covering the ZnO layer and the mesa, and including an opening exposing the ZnO layer;
   a first pad metal layer disposed on the lower insulation layer, and electrically connected to the first conductivity type semiconductor layer;
   a second pad metal layer electrically connected to the ZnO layer through the opening of the lower insulation layer, and horizontally spaced apart from the first pad metal layer; and
   an upper insulation layer covering the first pad metal layer and the second pad metal layer, the upper insulation layer having a first opening and a second opening exposing the first pad metal layer and the second pad metal layer, respectively,
   wherein a thickness of the ZnO layer under the opening of the lower insulation layer is smaller than that of the ZnO layer covered with the lower insulation layer.

2. The light emitting diode of claim 1,
   wherein the thickness of the ZnO layer under the opening of the lower insulation layer is, by 40 to 100 nm, smaller than that of the ZnO layer covered with the lower insulation layer.

3. The light emitting diode of claim 2,
   wherein the thickness of the ZnO layer under the opening of the lower insulation layer is 100 nm or more.

4. The light emitting diode of claim 1,
   wherein the lower insulation layer exposes the first conductivity type semiconductor layer along a periphery of the mesa, and
   wherein the first pad metal layer is connected to the first conductivity type semiconductor layer exposed along the periphery of the mesa.

5. The light emitting diode of claim 4,
   wherein the lower insulation layer includes a plurality of openings exposing the first conductivity type semiconductor layer along the periphery of the mesa, and
   wherein the first pad metal layer is connected to the first conductivity type semiconductor layer through the plurality of openings.

6. The light emitting diode of claim 5,
   wherein the mesa includes a plurality of grooves disposed along a side surface thereof, and
   wherein the plurality of openings of the lower insulation layer are disposed corresponding to the plurality of grooves.

7. The light emitting diode of claim 1,
   wherein the mesa has a through hole exposing the first conductivity type semiconductor layer through the second conductivity type semiconductor layer and the active layer,
   wherein the opening of the lower insulation layer exposes the first conductivity type semiconductor layer in the through hole, and
   wherein the first pad metal layer is connected to the first conductivity type semiconductor layer in the through hole.

8. The light emitting diode of claim 7,
   wherein the through hole has an elongated shape along the longitudinal direction of the light emitting diode.

9. The light emitting diode of claim 8,
   wherein the first pad metal layer covers the through hole, and
   wherein portions of the second pad metal layer are disposed along the through hole in the longitudinal direction of the through hole.

10. The light emitting diode of claim 7,
    wherein the lower insulation layer exposes the first conductivity type semiconductor layer along the periphery of the mesa, and
    wherein the first pad metal layer is also connected to the first conductivity type semiconductor layer exposed along the periphery of the mesa.

11. The light emitting diode of claim 1,
    wherein the first and the second openings of the upper insulation layer define pad regions of the light emitting diode.

12. The light emitting diode of claim 1, further comprising:
    a first bump pad and a second bump pad disposed on the upper insulation layer, and electrically connected to the first pad metal layer and the second pad metal layer, respectively.

13. The light emitting diode of claim 12,
    wherein the second pad metal layer is surrounded by the first pad metal layer, wherein the lower insulation layer is exposed in a boundary region between the first pad metal layer and the second pad metal layer, and
    wherein the exposed lower insulation layer is covered with the upper insulation layer.

14. The light emitting diode of claim 13,
    wherein the second pad metal layer is divided into a plurality of portions, and
    wherein the first pad metal layer surrounds each of the plurality of portions.

15. The light emitting diode of claim 14,
    wherein the first and the second bump pads are disposed over the plurality of portions of the second pad metal layer, respectively.

16. The light emitting diode of claim 1,
    wherein the opening of the lower insulation layer includes a plurality of openings exposing the ZnO layer.

17. The light emitting diode of claim 16,
    wherein the lower insulation layer is a distributed Bragg reflector.

18. The light emitting diode of claim 16,
    wherein the lower insulation layer is formed of $SiO_2$, and
    wherein the first pad metal layer and the second pad metal layer include a metal reflective layer.

19. The light emitting diode of claim 1,
    wherein the second opening of the upper insulation layer is disposed on the opening of the lower insulation layer exposing the ZnO layer, and
    wherein the first opening of the upper insulation layer is laterally spaced apart from the opening of the lower insulation layer exposing the ZnO layer.

20. The light emitting diode of claim 1,
    wherein the first and the second openings of the upper insulation layer are laterally spaced apart from the opening of the lower insulation layer exposing the ZnO layer.

* * * * *